(12) United States Patent
Wang et al.

(10) Patent No.: US 11,600,699 B2
(45) Date of Patent: Mar. 7, 2023

(54) SEMICONDUCTOR DEVICE STRUCTURE INTEGRATING AIR GAPS AND METHODS OF FORMING THE SAME

(71) Applicant: TAIWAN SEMICONDUCTOR MANUFACTURING COMPANY, LTD., Hsinchu (TW)

(72) Inventors: Chih-Ching Wang, Kinmen (TW); Kuan-Lun Cheng, Hsinchu (TW); Wen-Hsing Hsieh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 2 days.

(21) Appl. No.: 17/308,258

(22) Filed: May 5, 2021

(65) Prior Publication Data

US 2022/0359657 A1  Nov. 10, 2022

(51) Int. Cl.
*H01L 29/08* (2006.01)
*H01L 21/768* (2006.01)
(Continued)

(52) U.S. Cl.
CPC .... *H01L 29/0847* (2013.01); *H01L 21/76846* (2013.01); *H01L 23/528* (2013.01);
(Continued)

(58) Field of Classification Search
CPC ..... H01L 2225/06548; H01L 21/76898; H01L 2224/02372; H01L 2224/05009; H01L 2224/05025; H01L 2224/05087; H01L 2224/0509; H01L 2224/0557; H01L 2224/08146; H01L 2224/29009; H01L 2224/29025; H01L 23/5226; H01L 21/76877–76883; H01L 21/76807–76813; H01L 2221/1015–1036; H01L 21/76802–76817; H01L 27/0688; H01L 27/0694; H01L 2027/11883–11888; H01L 27/281; H01L 29/0843–0891; H01L 29/66636–66643; H01L 21/823418–823425; H01L 21/823814;
(Continued)

(56) References Cited

U.S. PATENT DOCUMENTS 9,105,490 B2   8/2015   Wang et al.
9,236,267 B2   1/2016   De et al.
(Continued)

*Primary Examiner* — Sonya McCall-Shepard
(74) *Attorney, Agent, or Firm* — NZ Carr Law Office

(57) ABSTRACT

A semiconductor device structure, along with methods of forming such, are described. In one embodiment, a semiconductor device structure is provided. The semiconductor device structure a first source/drain region, a second source/drain region, and a gate stack disposed between the first source/drain region and the second source/drain region. The semiconductor device structure also includes a conductive feature disposed below the first source/drain region. The semiconductor device structure also includes a power rail disposed below and in contact with the conductive feature. semiconductor device structure also includes a dielectric layer enclosing the conductive feature, wherein an air gap is formed between the dielectric layer and the conductive feature.

20 Claims, 33 Drawing Sheets

(51) Int. Cl.
  *H01L 23/528* (2006.01)
  *H01L 23/532* (2006.01)
  *H01L 29/06* (2006.01)
  *H01L 29/417* (2006.01)
  *H01L 29/423* (2006.01)

(52) U.S. Cl.
  CPC .... *H01L 23/53209* (2013.01); *H01L 29/0653* (2013.01); *H01L 29/41791* (2013.01); *H01L 29/4236* (2013.01); *H01L 2924/13067* (2013.01)

(58) Field of Classification Search
  CPC ....... H01L 29/41783; H01L 29/41725–41791; H01L 29/7839; H01L 29/806; H01L 29/41791; H01L 2029/7858; H01L 21/823821; H01L 27/0924; H01L 2221/1042–1047; H01L 29/0649–29/0653; H01L 23/5329–53295; H01L 21/76801–76837; H01L 23/481
  See application file for complete search history.

(56) References Cited

U.S. PATENT DOCUMENTS

| | | | |
|---|---|---|---|
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 2020/0411415 | A1* | 12/2020 | Wu .................. H01L 29/41775 |
| 2022/0139911 | A1* | 5/2022 | Wei .................... H01L 29/6681 257/365 |

* cited by examiner

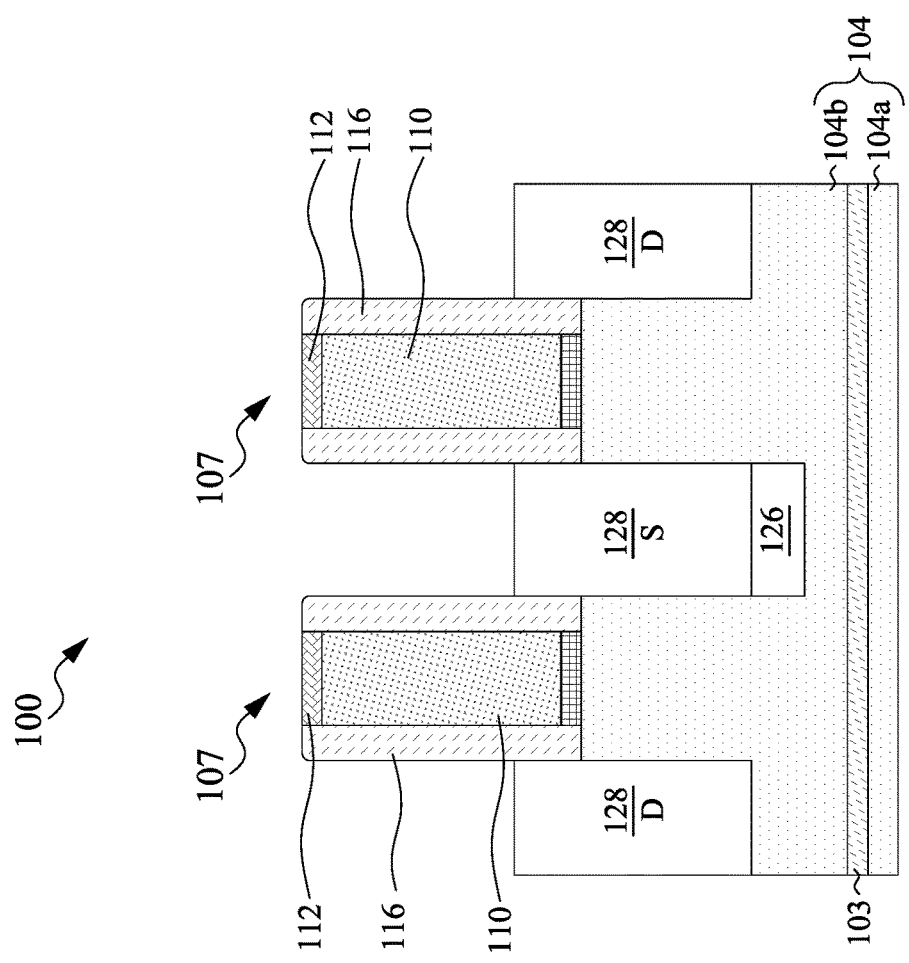
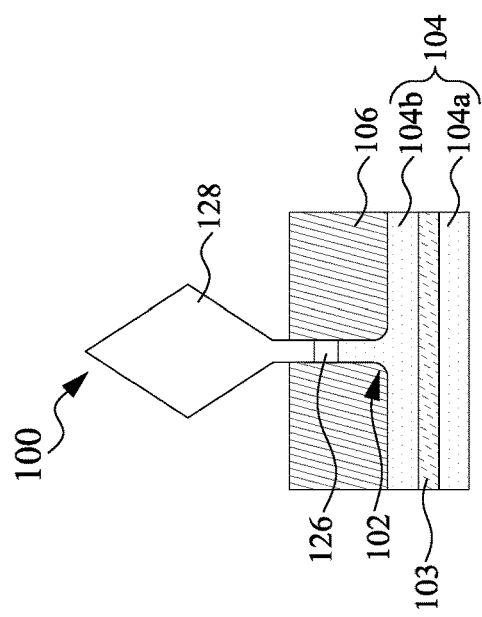
FIG. 8A
FIG. 8B

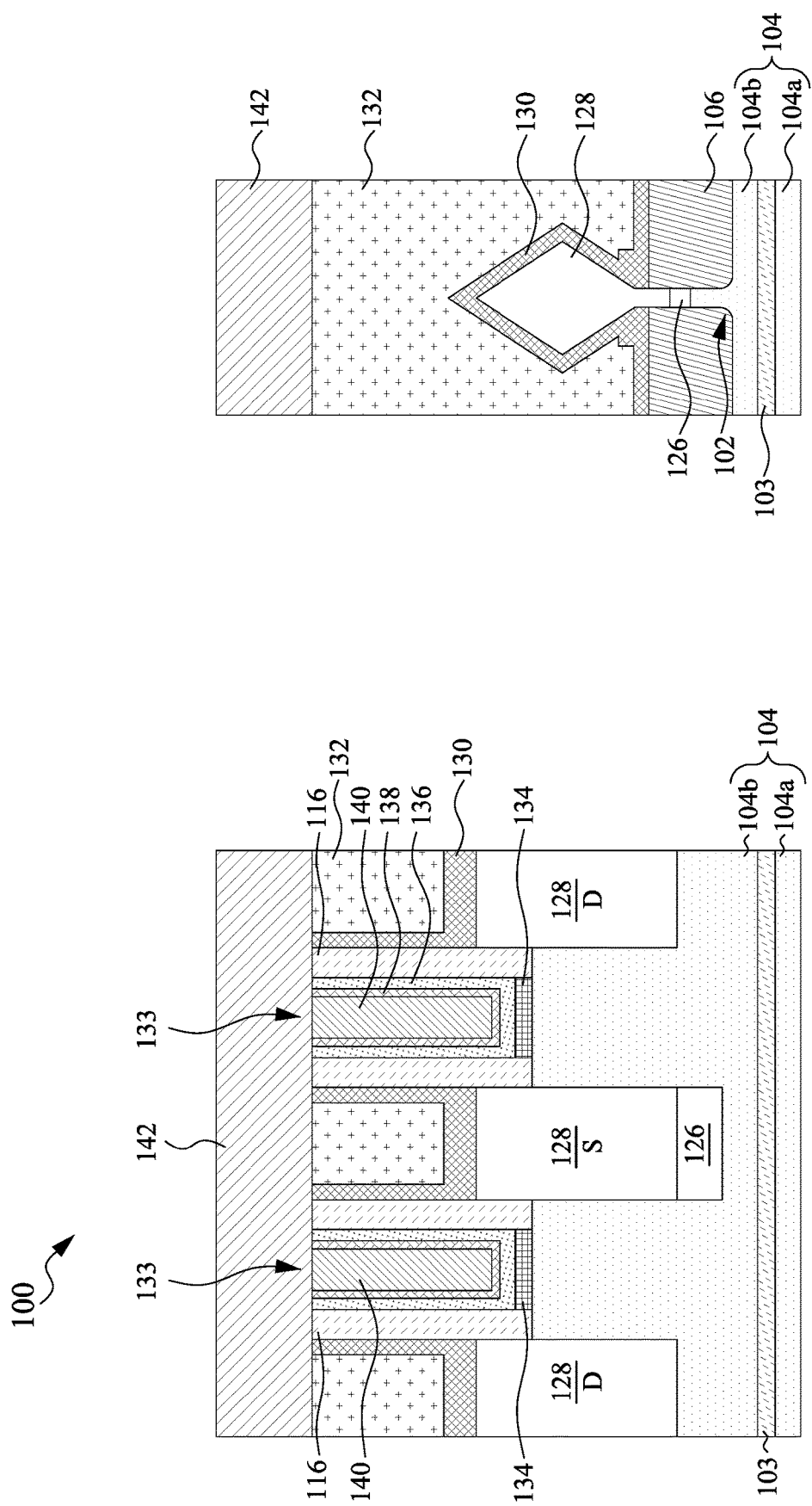

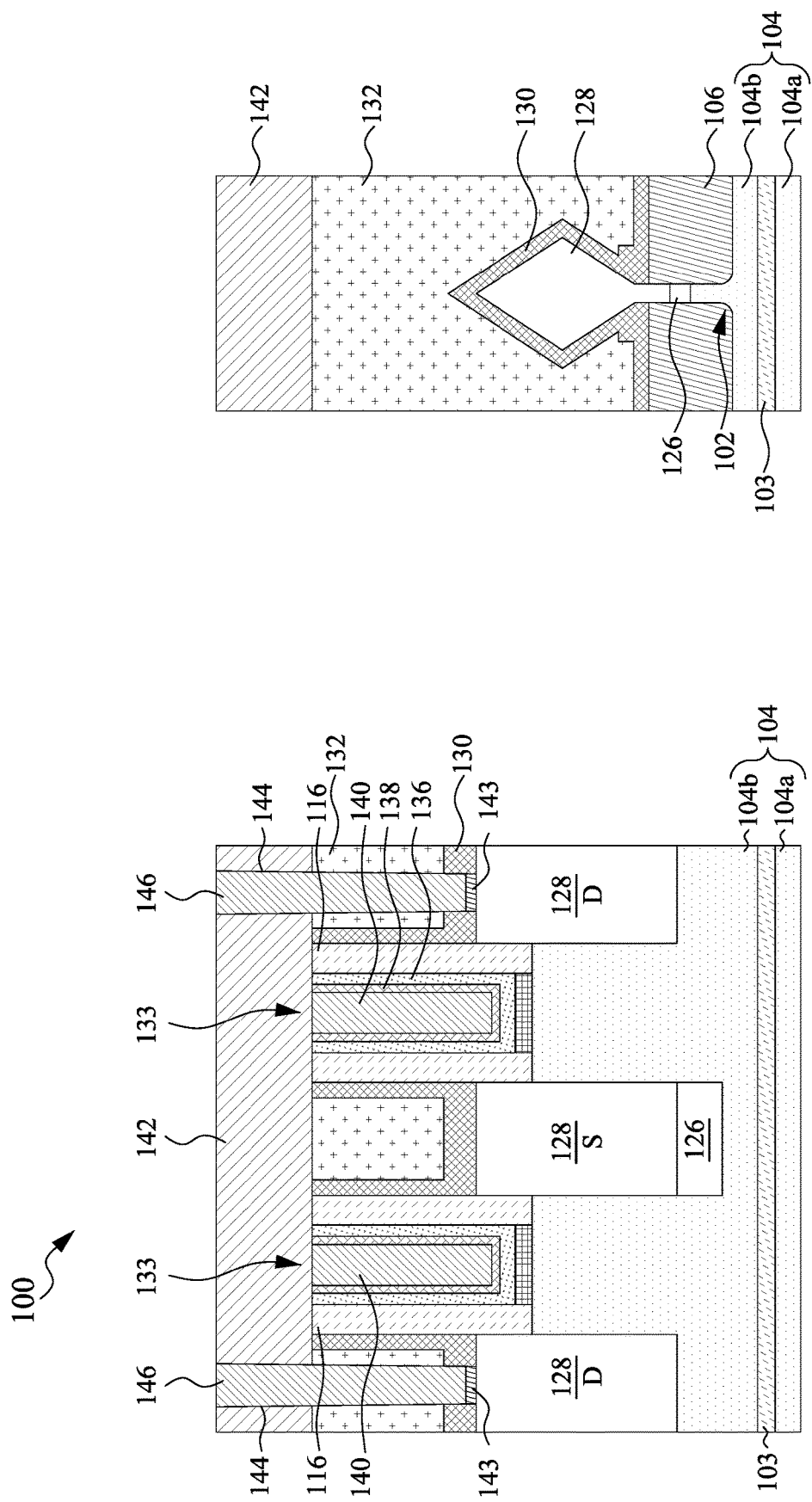

SEMICONDUCTOR DEVICE STRUCTURE INTEGRATING AIR GAPS AND METHODS OF FORMING THE SAME

BACKGROUND

Semiconductor integrated circuit (IC) industry has progressed into nanometer technology process nodes in pursuit of higher device density. When the size of the device is shrunk, parasitic electrical leakage may appear in the device due to capacitive coupling formed between an input wire and neighboring components, resulting in logic failures and degradation of timing in the device.

Therefore, there is a need for an improved device that solves the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3B to 11A-11B are cross-sectional views of the FinFET device of FIG. 1 according to various stages of the method depicted in FIG. 2.

DETAILED DESCRIPTION

Figure 1:
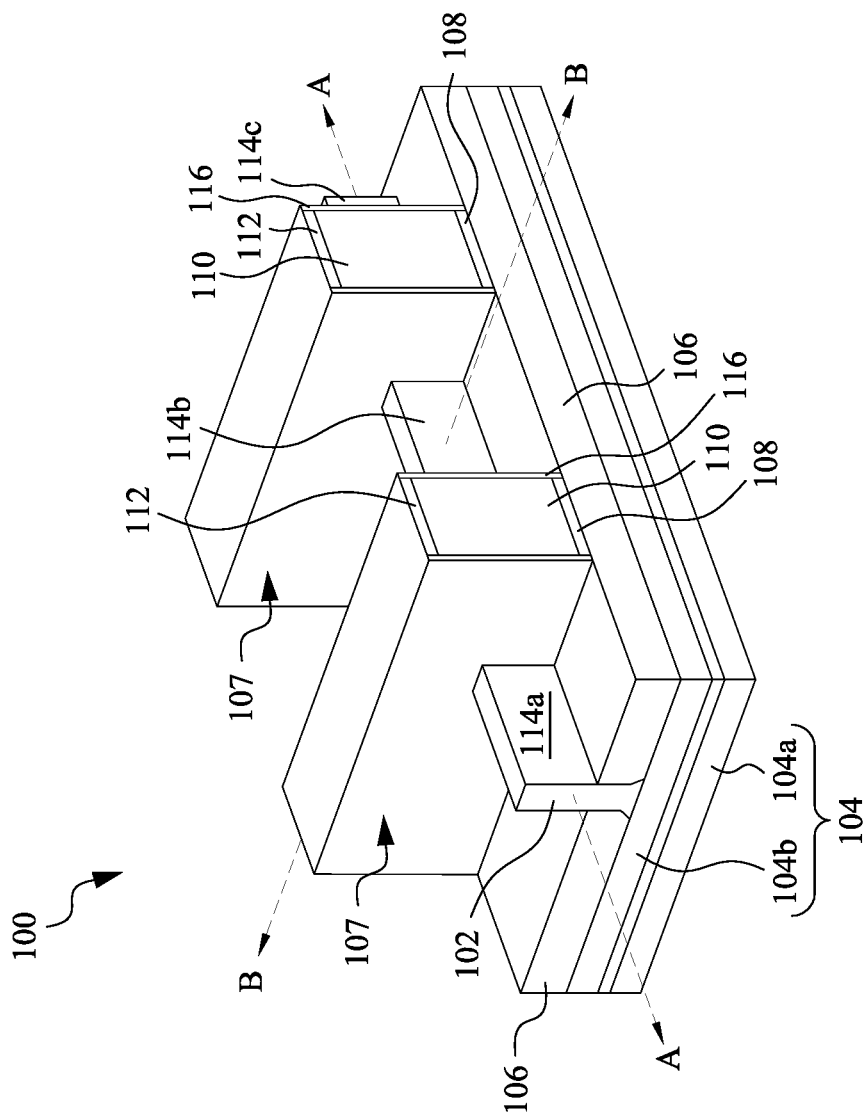
FIG. 1 illustrates an example of a simplified FinFET device in a three-dimensional view.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure describe an exemplary semiconductor device structure having power rails disposed at a backside of the semiconductor device structure. The power rails electrically connect a power supply node (VDD/VSS) to source/drain regions that are disposed at a front side of the semiconductor device through respective conductive feature. Particularly, the conductive features connecting to the source/drain regions are enclosed by an air gap. The air gap can effectively reduce a leakage current that may otherwise flow as a result of capacitive coupling formed between the conductive feature and the channel regions during operation. As a result, the performance of the semiconductor devices structure is improved.

The foregoing broadly outlines some aspects of embodiments described in this disclosure. While some embodiments described herein are described in the context of Fin-FETs, implementations of some aspects of the present disclosure may be used in other processes and/or in other devices, such as planar FETs, nanosheet channel FETs, Horizontal Gate All Around (HGAA) FETs, Vertical Gate All Around (VGAA) FETs, nanowire channel FETs, and other suitable devices. A person having ordinary skill in the art will readily understand other modifications that may be made are contemplated with the scope of this disclosure. In addition, although method embodiments may be described in a particular order, various other method embodiments may be performed in any logical order and may include fewer or more steps than what is described herein.

Figure 2:
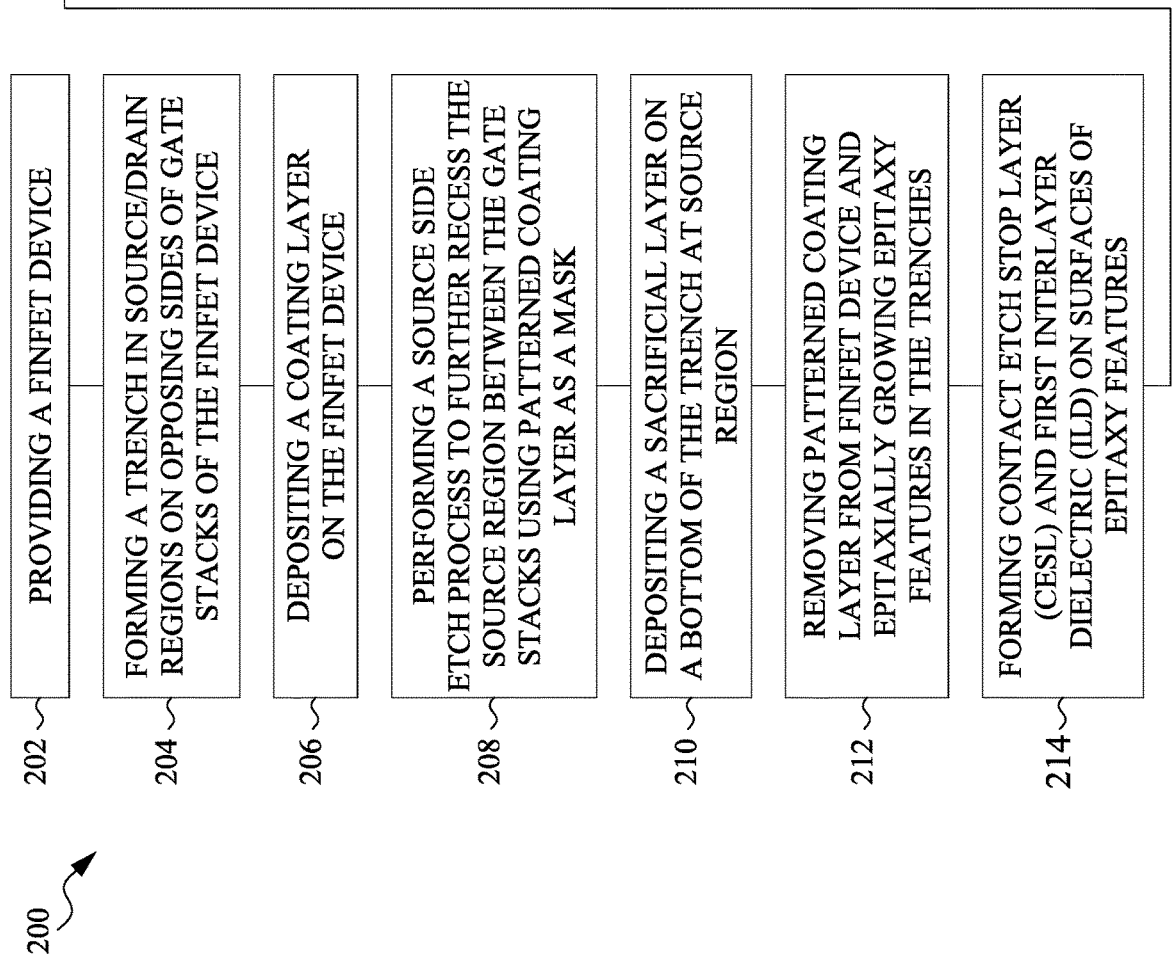
FIG. 2 is a flowchart of an exemplary method for forming the semiconductor device shown in FIGS. 1 and 3A-3B through 25 according to embodiments of the present disclosure.
Figure 2:
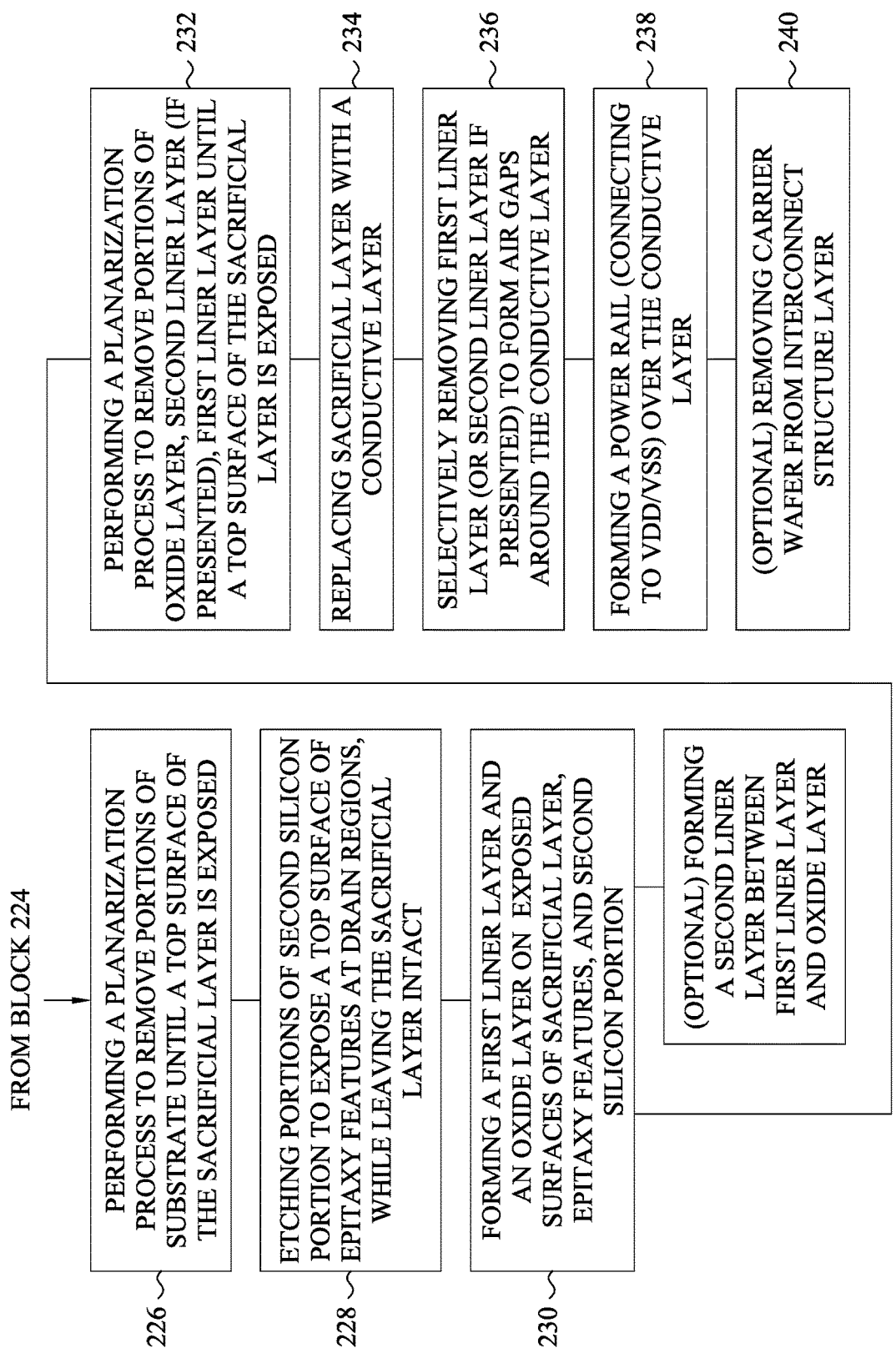

FIG. 1 illustrates an example of a simplified FinFET device 100 in a three-dimensional view. FIG. 2 is a flowchart of an exemplary method 200 for forming the FinFET device 100 shown in FIGS. 1 and 3A-3B through 11A-11B according to embodiments of the present disclosure. FIGS. 3A-3B through 11A-11B are cross-sectional views of the FinFET device 100 according to various stages of the method 200 of FIG. 2. The figures ending with an "A" designation illustrate cross-sectional views at various instances of processing corresponding to cross-section A-A shown in FIG. 1, which is in a plane along the longitudinal direction of a fin 102 extending through source/drain regions 114a, 114b, 114c. The figures ending with a "B" designation illustrate cross-sectional views at various instances of processing corresponding to cross-sectional B-B shown in FIG. 1, which is in a plane perpendicular to cross-section A-A and is across source/drain region 114b in the fin 102. It is noted that the figures are for illustration purposes and thus are not necessarily drawn to scale.

In addition, while only one fin 102 is shown, two or more fins may be arranged along the Y direction. In such a case, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figures 3A, 3B:
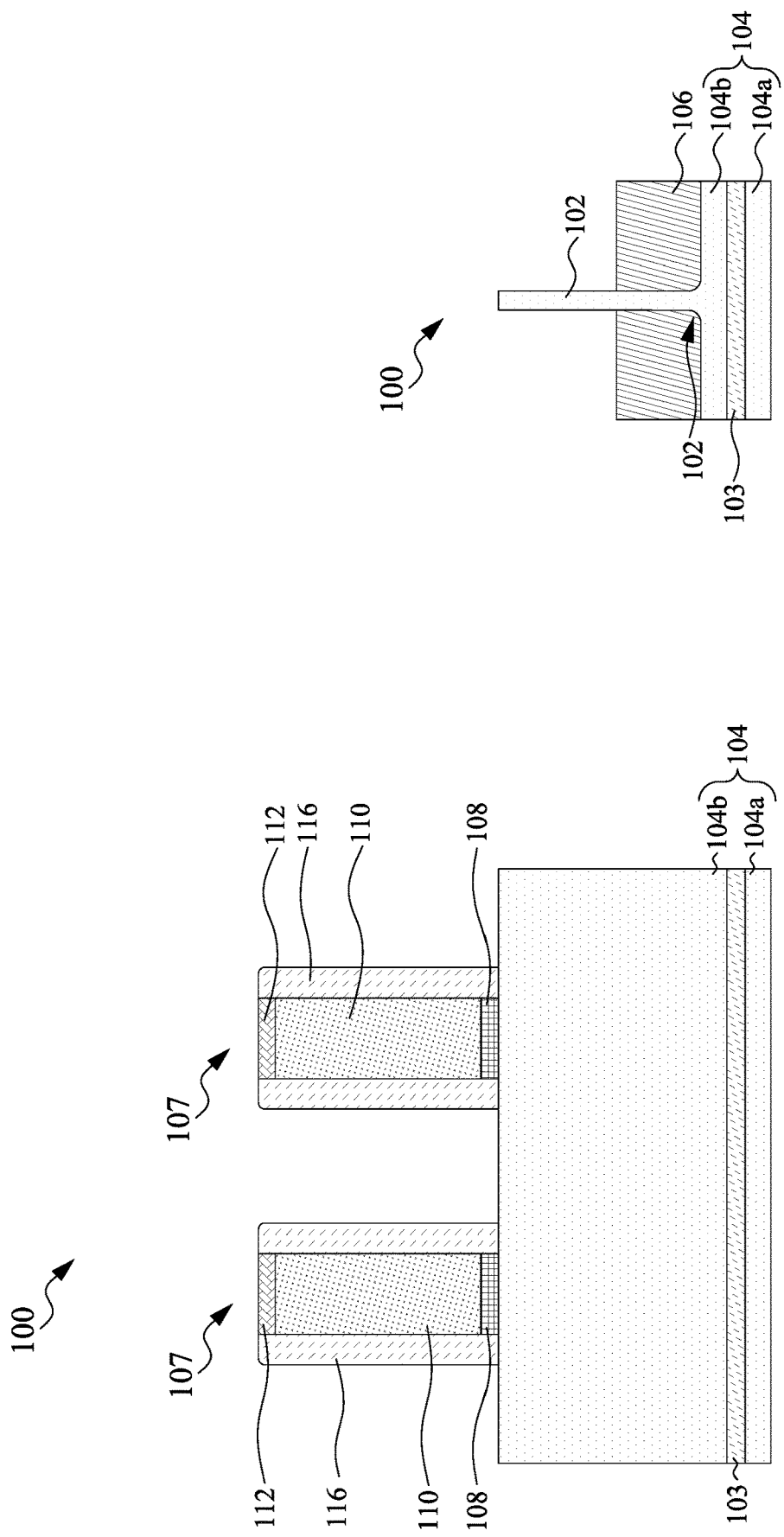

Referring to FIG. 2, the method 200 begins at operation 202 where a FinFET device 100 is provided, as shown in FIGS. 1, 3A and 3B. The FinFET device 100 generally includes a fin 102 extending along a first direction above a substrate 104. The first direction is parallel to the axis X shown in FIG. 1. The substrate 104 may be or include a bulk semiconductor substrate, a semiconductor-on-insulator (SOI) substrate, or the like, which may be doped (e.g., with a p-type or an n-type dopant) or undoped. In one aspect as shown, the substrate 104 is a SOI substrate. The substrate 104 includes a first silicon portion 104a and a second silicon portion 104b. The first silicon portion 104a and the second silicon portion 104b are isolated by an insulator 103, which may be a buried oxide (BOX) layer, a silicon oxide layer, or the like. Other substrates, such as a multi-layered or gradient substrate may also be used. In some embodiment, the substrate 104 may include an elemental semiconductor including germanium (Ge); a compound semiconductor including SiC, GaAs, GaP, InP, InAs, InSb, SiGe, GaAsP, AlInAs, AlGaAs, GaInAs, GaInP, or GaInAsP; or any combination thereof. In some embodiments, the fin 102 may include an arbitrary number of first and second semiconductor layers alternatingly arranged in which the first semiconductor layer is silicon and the second semiconductor layer is SiGe. In such a case, the second semiconductor layer may be removed at a later stage and replaced with a gate electrode.

The FinFET device 100 includes isolation regions 106 formed on a first side of the substrate 104. In this disclosure, the first side of the substrate 104, on which the transistors (e.g., source/drain regions 114a, 114b, 114c and gate stacks 107 to be discussed below) are formed, is referred to as a front side of the substrate 104 or a front side of the FinFET device 100. A second side of the substrate 104, on which a backside contact structure is to be formed, is opposite to the first side of the substrate 104 and referred to herein as a backside of the substrate 104 or a backside of the FinFET device 100. The isolation regions 106 may include or be an insulating material such as an oxygen-containing material or a nitrogen-containing material, or a combination thereof. The insulating material may be formed by a high density plasma chemical vapor deposition (HDP-CVD), a flowable CVD (FCVD), or other suitable deposition process. In one aspect, the isolation regions 106 includes silicon oxide that is formed by a FCVD process. The insulating material may then be recessed to form the isolation regions 106. The insulating material is recessed such that the fin 102 protrudes from between neighboring isolation regions 106. The insulating material may be recessed using any suitable etch process, such as a dry etching, a wet etching, and/or other suitable etching method (e.g., reactive ion etching).

Gate stacks 107 are then formed over and extend across the fin 102 along a second direction substantially perpendicular to the first direction. The second direction is parallel to the axis Y shown in FIG. 1. The gate stacks 107 wrap a portion of the fin 102 protruding over the isolation regions 106. Each gate stack 107 comprises a gate dielectric layer 108, a gate layer 110, and a mask 112. The gate stacks 107 can be operational gate stacks in a gate-first process or can be dummy (sacrificial) gate stacks in a replacement gate process. In one embodiment where a replacement gate process is to be used, the gate dielectric layer 108 may be an interfacial dielectric, and the gate layer 110 may be a dummy gate. The interfacial dielectric, dummy gate, and mask for the gate stacks 107 may be formed by sequentially forming respective layers, and then patterning those layers into the gate stacks 107. A layer for the interfacial dielectric includes an oxygen-containing material or a nitrogen-containing material, or multilayers thereof, and may be thermally and/or chemically grown on (or conformally deposited) the fin 102, such as by PECVD, ALD, or other suitable deposition technique. A layer for the dummy gate may include or be silicon (e.g., polysilicon) or any suitable material, deposited by CVD, PVD, or any suitable deposition technique. A layer for the mask may include or be silicon nitride, silicon oxynitride, silicon carbon nitride, or the like, or a combination thereof, deposited by CVD, PVD, ALD, or any suitable deposition technique. The layers of the mask, dummy gates, and interfacial dielectrics may then be patterned to form the mask 112, gate layer 110, and gate dielectric layer 108 for each gate stack 107.

Gate spacers 116 are formed along sidewalls of the gate stacks 107 (e.g., sidewalls of the gate dielectric layers 108, gate layers 110, and masks 112) and over the fin 102. The gate spacers 116 may be formed by conformally depositing one or more layers for the gate spacers 116 and anisotropically etching the one or more layers, for example. The one or more layers for the gate spacers 116 may include or be silicon oxycarbide, silicon nitride, silicon oxynitride, silicon carbon nitride, the like, multi-layers thereof, or a combination thereof, and may be deposited by CVD, ALD, or another suitable deposition technique.

Source/drain regions are disposed in opposing regions of the fin 102 with respect to each gate stack. In some cases, some source/drain regions may be shared between various transistors. For example, various one of the source/drain regions may be connected or coupled together such that FinFET device 100 is implemented as two functional transistors. The structure in FIG. 1 may be electrically connected or coupled in a manner or operate as, for example, one transistor or more, such as four transistors. For exemplary illustration purposes, in this disclosure the region 114b between the gate stacks 107 is designated as a source region for the FinFET device 100, while the regions 114a and 114c are designated as drain regions for the FinFET device 100. However, it should be understood that the source region and the drain region can be interchangeably used as the structures thereof are substantially the same.

Figures 4A, 4B:
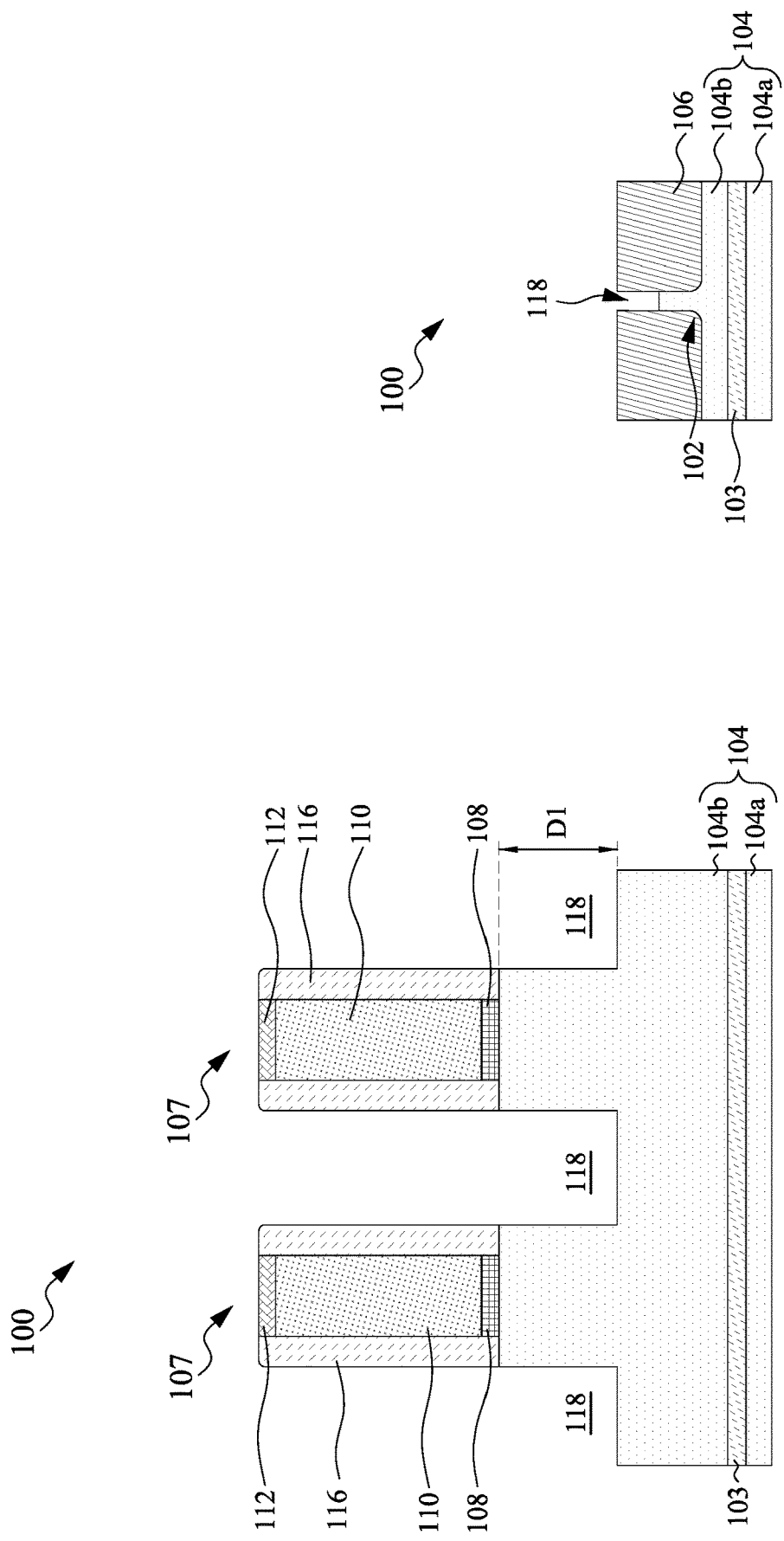

At operation 204, trenches 118 are formed in the source/drain regions 114a, 114b, 114c on opposing sides of the gate stacks 107 by removing portions of the fin 102 not covered by the gate stacks 107, as shown in FIGS. 4A and 4B. The formation of the trenches 118 can be done by an etch process, either isotropic or anisotropic etch process, or further, may be selective with respect to one or more crystalline planes of the substrate 104. The trenches 118 can have various cross-sectional profiles based on the etch process implemented. The etch process may be a dry etch, such as a RIE, NBE, or the like, or a wet etch, such as using tetramethylammonium hydroxide (TMAH), ammonium hydroxide ($NH_4OH$), or any suitable etchant. The trenches 118 at the source/drain regions 114a, 114b, 114c have a first depth "D1", which is a distance measuring from the top surface of the fin 102 under the gate stacks 107 to the bottom of the trenches 118. In one embodiment, the first depth "D1" may be in a range between 20 nm and 45 nm.

Figure 5B:
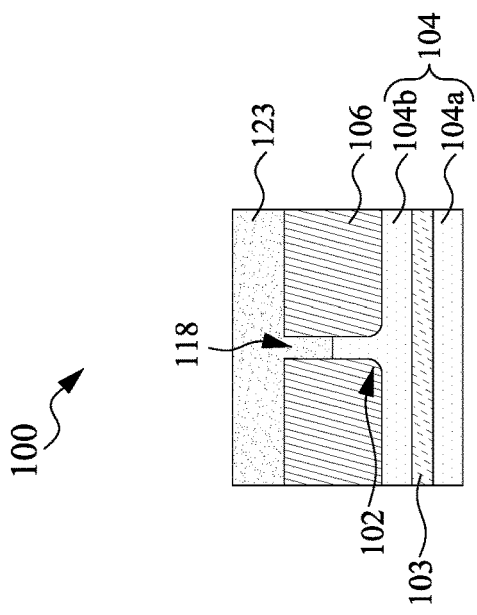
Figure 5A:
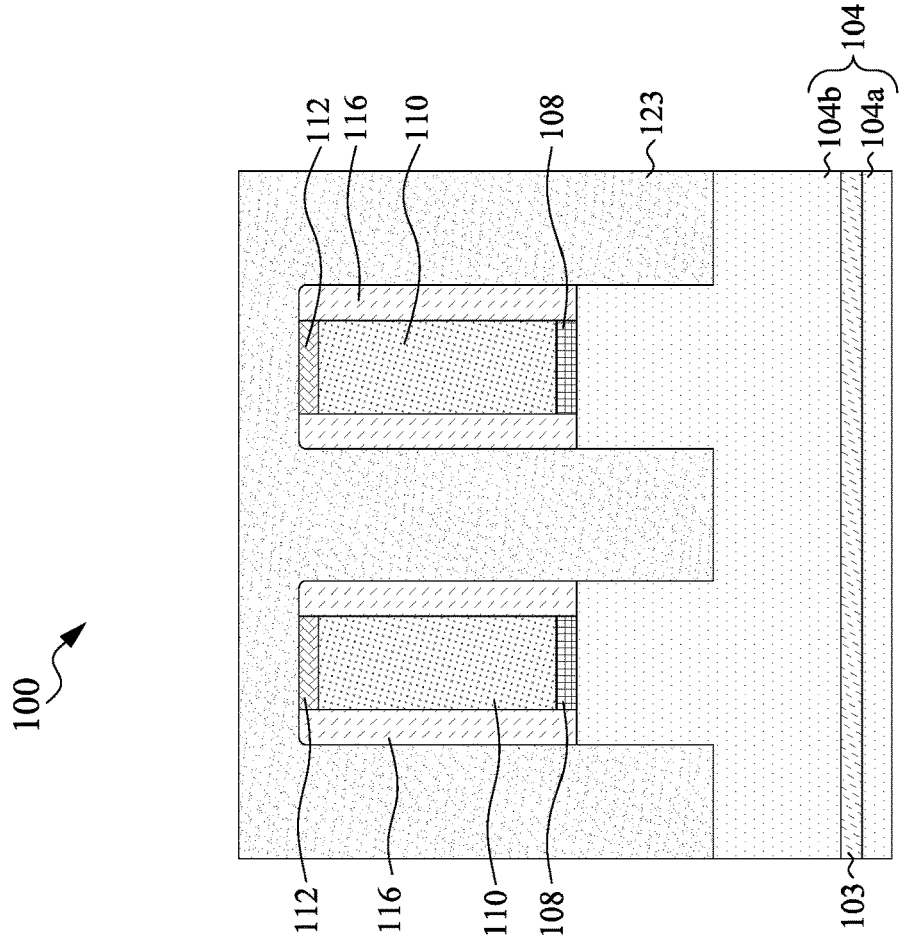

At operation 206, a coating layer 123 is disposed on the FinFET device 100, as shown in FIG. 5A. The coating layer 123 may be a multi-layer resist, such as a tri-layer resist layer including a bottom layer, a middle layer formed over the bottom layer, and a photoresist layer formed over the middle layer. The bottom layer may be a bottom anti-reflective coating (BARC) layer that fills in the trenches 118 and above the gate stacks 107 to a predetermined height. The bottom layer may include or be a carbon backbone polymer or a silicon-free material formed by a spin-on coating process, a CVD process, a FCVD process, or any suitable deposition technique. The middle layer may be a composition that provides anti-reflective properties and/or hard mask properties for a photolithography process. The middle layer provides etching selectivity from the bottom layer and the photoresist layer. The middle layer may include or be amorphous silicon, silicon carbide, silicon nitride, silicon oxynitride, silicon oxide, a silicon-containing inorganic polymer, or any combination thereof. The photoresist layer may include or be a DUV resist (KrF) resist, an argon fluoride (ArF) resist, an EUV resist, an electron beam (e-beam) resist, or an ion beam resist.

Figures 6A, 6B:
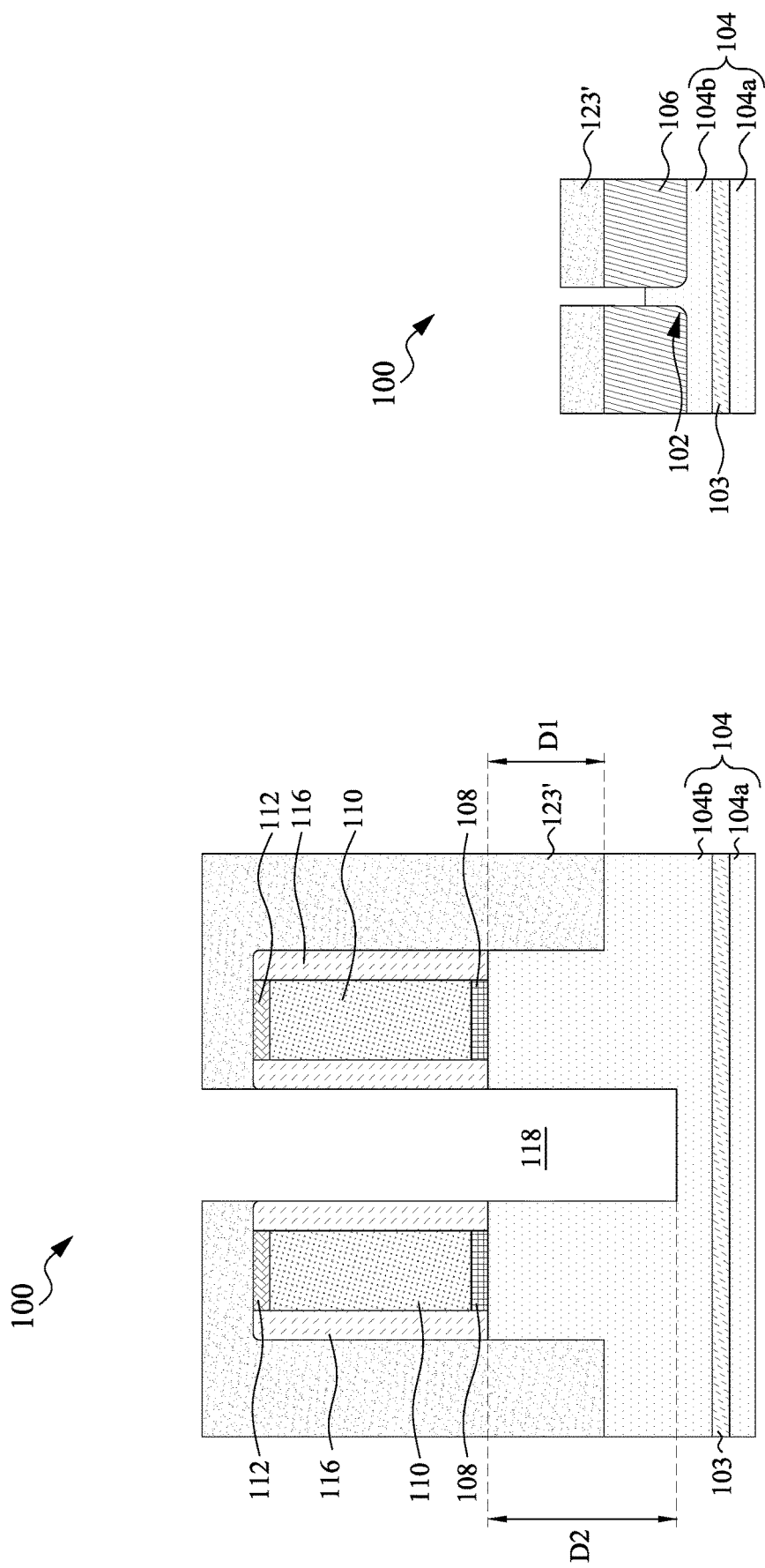

At operation 208, portions of the bottom layer, the middle layer, and the photoresist layer are removed by one or more photolithographic processes to form patterned coating layer 123', as shown in FIGS. 6A and 6B. An etch process, such as the etch process discussed at operation 204 above, can be performed to etch at least a portion of the second silicon portion 104b of the substrate 104 at the source region 114b, using the patterned coating layer 123' as a mask. The source region 114b between the gate stacks 107 is hence further recessed after the source side etch process. The trench 118 at the source region 114b has a second depth "D2", which is distance measuring from the top surface of the fin 102 under the gate stacks 107 to the bottom of the trench 118. The second depth "D2" is greater than the first depth "D1". In one embodiment, the second depth "D2" may be in a range between 50 nm and 100 nm. If the second depth "D2" is greater than 100 nm, the manufacturing cost is increased without significant advantage. On the other hand, if the second depth "D2" is less than 50 nm, a thickness of a subsequent sacrificial layer (e.g., sacrificial layer 126) may be insufficient to protect the epitaxy feature at the source region/terminal ("S") and affect the functionality of the epitaxy feature at the source region/terminal ("S").

Figures 7A, 7B:
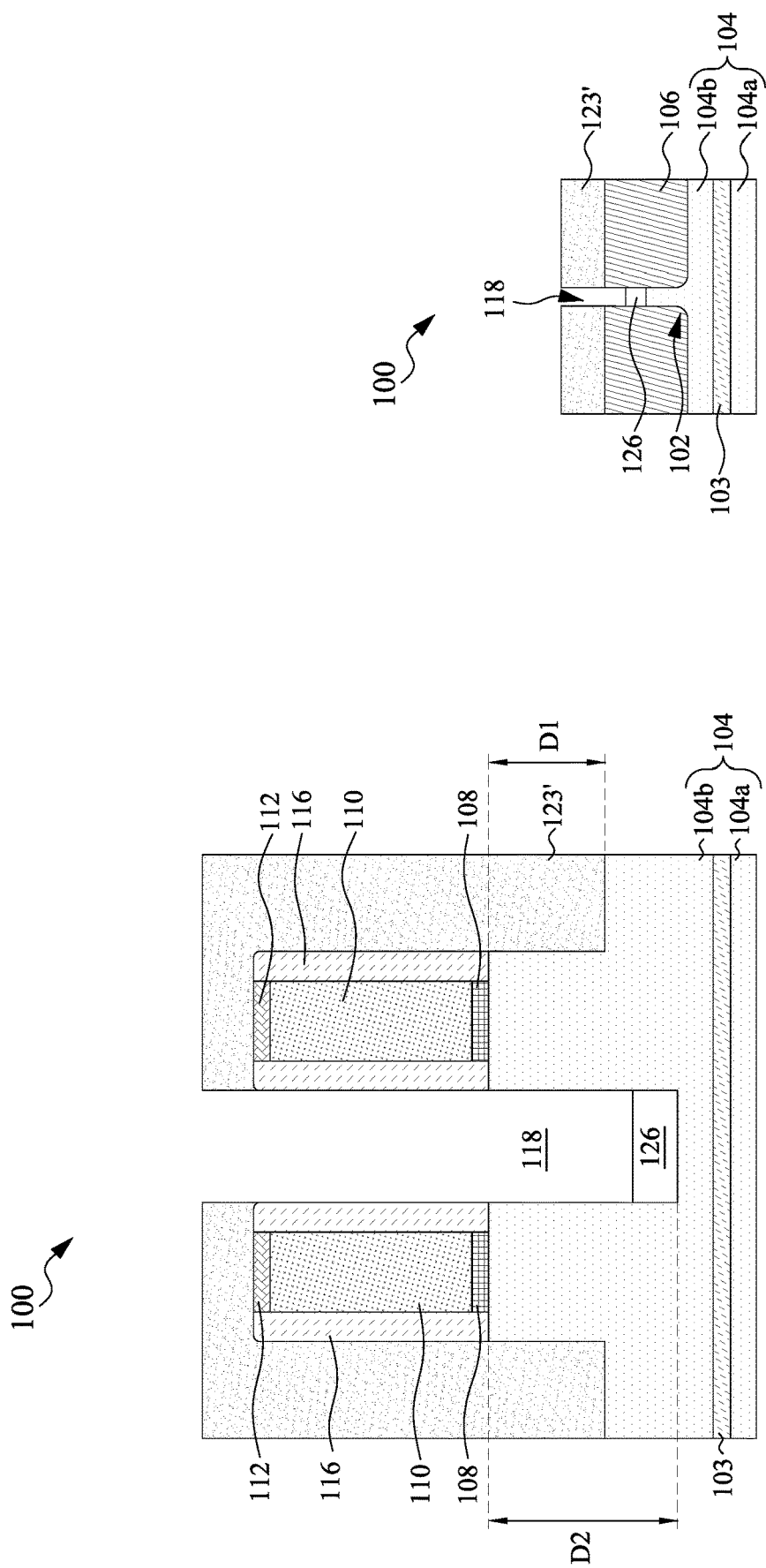

At operation 210, a sacrificial layer 126 is deposited or epitaxially grown on the bottom of the trench 118, as shown in FIGS. 7A and 7B. The sacrificial layer 126 covers the exposed portion of the second silicon portion 104b of the substrate 104 at the source region 114b. The sacrificial layer 126 may have a thickness in the range of about 10 nm to about 50 nm, and may be deposited by CVD, CVD epitaxy, molecular beam epitaxy (MBE), or any suitable deposition technique. The sacrificial layer 126 will be replaced by a conductive material of a backside contact structure to be formed on the backside of the substrate at a later stage.

The material of the sacrificial layer 126 is chosen such that the sacrificial layer 126 has a different etch selectivity with respect to the second silicon portion 104b and a dielectric material, such as an oxide. In various embodiments, the sacrificial layer 126 may be a silicon germanium (SiGe) layer. The SiGe layer may be a single crystal SiGe layer, a graded SiGe layer where a germanium concentration varies with the distance from the interface of the graded SiGe layer with the exposed second silicon portion 104b, or a non-graded SiGe where a germanium concentration does not vary with the distance from the interface of the non-graded SiGe layer with the exposed second silicon portion 104b. In some cases, the SiGe layer can have a germanium composition percentage between about 50% and 95%.

At operation 212, the patterned coating layer 123' is removed and epitaxy features 128 are formed in the trenches 118 at the source/drain regions 114a, 114b, 114c (indicated as "S" and "D" for exemplary illustration purposes), as shown in FIGS. 8A and 8B. Particularly, the epitaxy feature 128 at the source region/terminal "S" is in contact with the sacrificial layer 126. The patterned coating layer 123' may be removed using any suitable technique such as ashing, stripping, or the like. The epitaxy features 128 may include or be pure or substantially pure Si or Ge, a III-V compound semiconductor, a II-VI compound semiconductor. Exemplary epitaxy features 128 may include, but are not limited to, Ge, SiGe, GaAs, AlGaAs, GaAsP, SiP, InAs, AlAs, InP, GaN, InGaAs, InAlAs, GaSb, AlP, GaP, and the like. The epitaxy features 128 may include p-type dopants, such as boron or $BF_2$; n-type dopants, such as phosphorus or arsenic; and/or other suitable dopants including combinations thereof.

The epitaxy features 128 may be formed by performing an epitaxial growth process that provides an epitaxial material on the exposed second silicon portion 104b of the substrate 104 in the source/drain regions 114a, 114b, 114c, such as by metal-organic CVD (MOCVD), ultra-high vacuum CVD (UHV-CVD), molecular beam epitaxy (MBE), liquid phase epitaxy (LPE), vapor phase epitaxy (VPE), selective epitaxial growth (SEG), or other suitable processes. The dopants, if used, may be implanted into the epitaxy features 128 during or after epitaxial growth process. During the epitaxial growth process, the gate stacks 107 and isolation regions 106 limit the epitaxy features 128 to the source/drain regions 114a, 114b, 114c. Due to blocking of the isolation regions 106, epitaxy features 128 are first grown vertically in the trenches 118 until the trenches are fully filled. The epitaxy features 128 may then grow vertically and horizontally to form facets, which may correspond to crystalline planes of the substrate 104. While not shown, in some cases the epitaxy features 128 are grown in a way that they are partially merged with the adjacent epitaxy features.

Figure 9B:
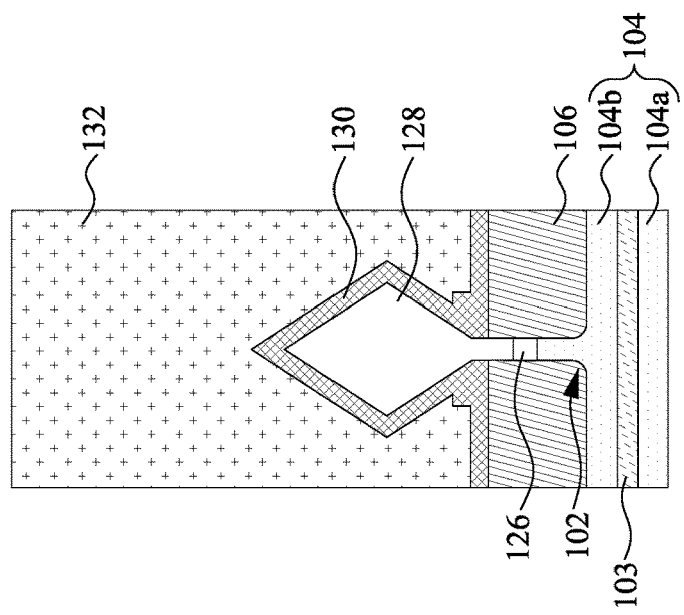
Figure 9A:
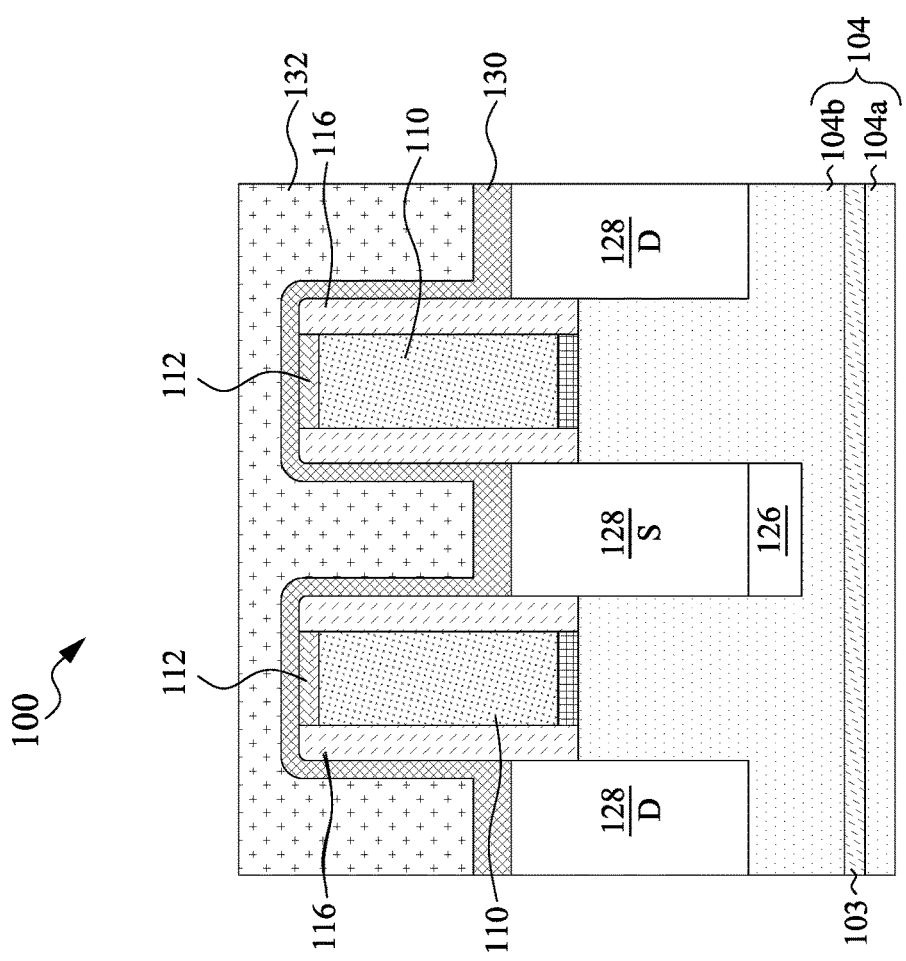

At operation 214, a contact etch stop layer (CESL) 130 and a first interlayer dielectric (ILD) 132 are formed on surfaces of the epitaxy features 128, sidewalls and top surfaces of the gate spacers 116, top surfaces of the mask 112, and top surfaces of the isolation regions 106, as shown in FIGS. 9A and 9B. The CESL 130 can provide a mechanism to stop an etch process when forming contacts or vias at the later stage. The CESL layer 130 is conformally deposited on surfaces of the epitaxy features 128, sidewalls and top surfaces of the gate spacers 116, top surfaces of the mask 112, and top surfaces of the isolation regions 106. The CESL 130 may include or be silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The first ILD 132 may include or be tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than silicon dioxide), and may be deposited by spin-on, CVD, FCVD, PECVD, PVD, or any suitable deposition technique.

At operation 216, a planarization process, such as a CMP, is performed to remove portions of the first ILD 132, the CESL 130, the masks 112, and the gate spacers 116. The planarization process is performed such that the masks 112 and upper portions of the gate spacers 116 are removed and the top surfaces of the first ILD 132 and CESL 130 are leveled with the top surfaces of the gate layer 110. Accordingly, top surfaces of the gate layers 110 are exposed through the first ILD 132 and the CESL 130. In the replacement gate process, the gate layers 110 and the gate dielectric layers 108 are removed, such as by one or more etch processes (such as selective wet etch or selective dry etch). For example, the gate layers 110 may be removed by an etchant that is selective to the gate layers 110, wherein the gate dielectric layers 108 act as etch stop layers, and subsequently, the gate dielectric layers 108 can optionally be removed by a different etchant that is selective to the gate dielectric layers 108. The etch processes can be a RIE, NBE, a wet etch, or any suitable etch process. Recesses are formed between gate spacers 116 where the gate stacks 107 were removed, and channel region of the fin 102 is exposed through the recesses.

The replacement gate stacks 133 are then formed in the recesses between gate spacers 116. The replacement gate stacks 133 each may include, as illustrated in FIG. 10A, an interfacial dielectric 134, a gate dielectric layer 136, one or more optional conformal layers 138, and a gate electrode 140. The interfacial dielectric 134 is formed on top surfaces of the exposed portions of the second silicon portion 104b along the channel regions. The interfacial dielectrics 134 can be the gate dielectric layer 108 (if not removed), a nitride, an oxide formed by thermal oxidation of the exposed portions of the second silicon portion 104b, and/or any suitable dielectric layer formed by CVD, ALD, MBD, or any suitable deposition technique.

The gate dielectric layers 136 can be conformally deposited in the recesses where gate stacks 107 were removed (e.g., on top surfaces of the isolation regions 106, on the interfacial dielectric 134, and sidewalls of the gate spacers 116) and on the top surfaces of the first ILD 132, the CESL 130, and gate spacers 116. The gate dielectric layers 136 can be or include silicon oxide, silicon nitride, a high-k dielectric material having a k value greater than about 7.0, multilayers thereof. The one or more optional conformal layers 138 can include one or more barrier and/or capping layers (e.g., TaN, TiN or the like) and one or more work-function tuning layers (e.g., aluminum titanium carbide, aluminum titanium oxide, aluminum titanium nitride, or the like), and may be deposited by ALD, PECVD, MBD, or any suitable deposition technique.

The gate electrode 140 is formed over the one or more conformal layers 138 (if implemented) until remaining recesses (where the gate stacks 107 were removed) are filled. The gate electrode 140 may be or include a metal-containing material such as tungsten, cobalt, aluminum, ruthenium, copper, multilayers thereof, or the like, and can be deposited by ALD, PECVD, MBD, PVD, or any suitable deposition technique. The region 141 (e.g., regions indicated by a dashed line) in the second silicon portion 104b between the epitaxy features 128 is typically referred to as channel regions, which become a conductive path when a voltage is applied to the gate electrodes 140.

Thereafter, portions of the layer for the gate electrode 140, one or more conformal layers 138, and gate dielectric layer 136 above the top surfaces of the first ILD 132, the CESL 130, and gate spacers 116 are removed by a planarization process. A second ILD 142 is then formed over the first ILD 132, the CESL 130, and gate spacers 116, as shown in FIGS. 10A and 10B. The second ILD 142 may be the same material as the first ILD 132.

At operation 218, openings 144 are formed through the second ILD 142, the first ILD 132, and the CESL 130 to expose at least portions of the epitaxy features 128 at the drain regions "D". Conductive features 146 are then formed and filled in the openings 144, as shown in FIG. 11A. In some cases, the opening 144 may also formed through the second ILD 142, the first ILD 132, and the CESL 130 to expose at least portions of the epitaxy features 128 at the source region/terminal "S", and be filled with a conductive feature. Each conductive feature 146 includes a conductive material, which may be or include tungsten, cobalt, copper, ruthenium, aluminum, gold, silver, alloys thereof, or a combination thereof, and may be deposited by CVD, ALD, PVD, or any suitable deposition technique. While not shown, each conductive feature 146 may further include an adhesion layer (e.g., Ti, Ta, or the like) conformally deposited in the openings 144 on exposed surfaces of the epitaxy features 128 and the second ILD 142, and a barrier layer (e.g., TiN, TaN, or the like) conformally deposited on the adhesion layer, and both can be deposited by ALD, CVD, or any suitable deposition technique. Silicide regions 143 may be formed on the top surface of the epitaxy features 128 by reacting upper portions of the epitaxy features 128 with the adhesion layer (not shown), and possibly, the barrier layer (not shown).

Figure 12:
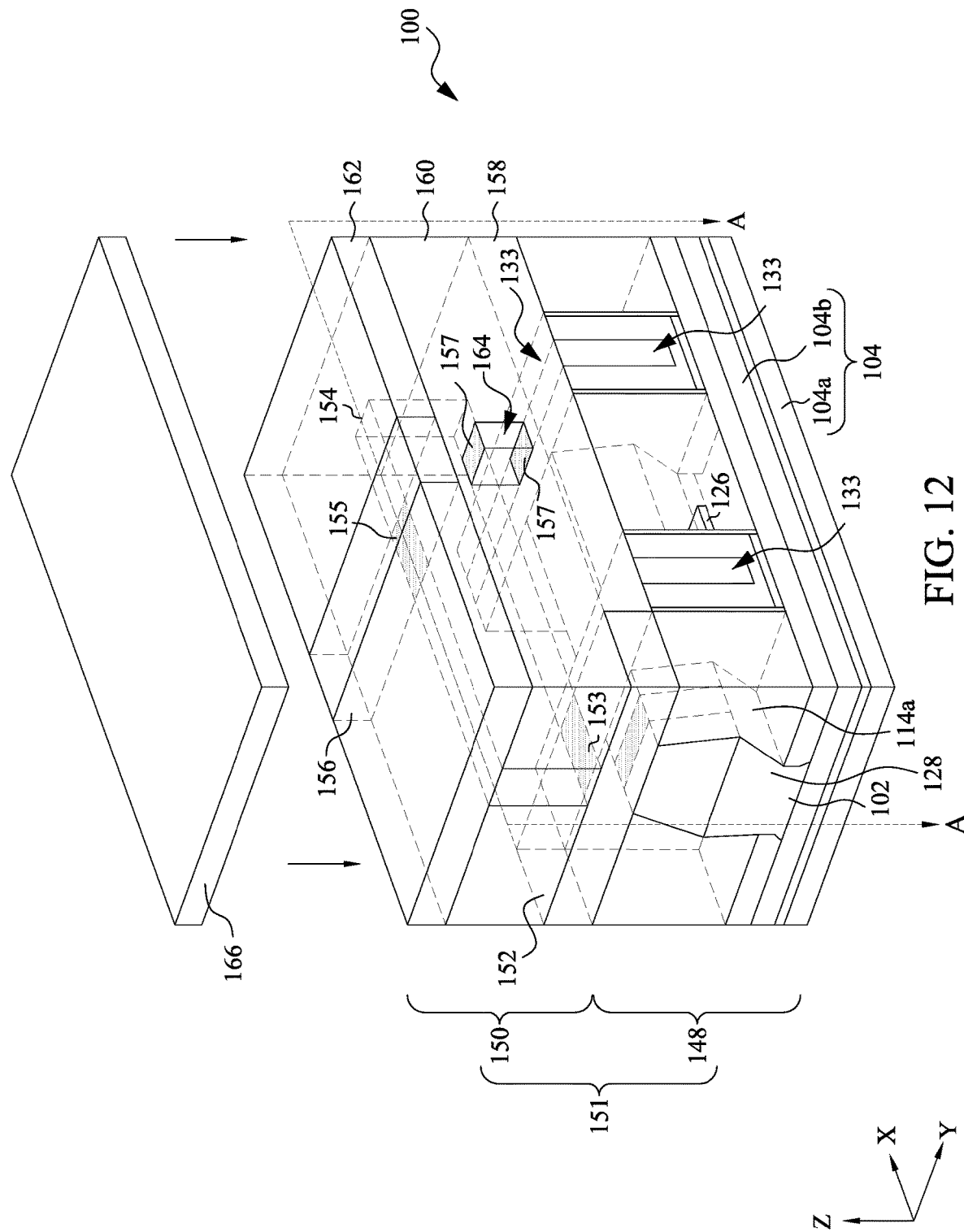
FIG. 12 is an isometric view of a layer structure of the FinFET device having a back-end-of-line (BEOL) interconnect structure and a carrier wafer sequentially formed thereon.

At operation 220, an interconnect structure layer 150 is formed over the FinFET device 100, as shown in FIG. 12. For ease of illustration purpose, the layer structure of the FinFET device 100 is referred to herein as a transistor structure layer 148. FIG. 12 is an isometric view of the interconnect structure layer 150 disposed over the transistor structure layer 148. The transistor structure layer 148 and the interconnect structure layer 150 can be referred to as a device wafer 151. While only one transistor is shown, it is contemplated that the transistor structure layer 148 can include a plurality of FinFET devices 100 each having features described in FIGS. 3A-3B through 11A-11B.

The interconnect structure layer 150 can include a back-end-of-line (BEOL) interconnect structure formed on the front side of the FinFET device 100. The interconnect structure layer 150 may include a plurality of metal lines 152, 154, and 156, and a plurality of dielectric layers 158, 160, and 162. The dielectric layer 160 is formed on the dielectric layer 158, and the dielectric layer 162 is formed on the dielectric layer 158. The interconnect structure layer 150 may also include a plurality of vertical interconnect features, such as vias, and horizontal interconnect features, such as metal lines, embedded in dielectric layers. A dielectric layer (e.g., dielectric layers 158, 160, 162) having metal lines or vias can be referred to as a metal layer. In some cases, the interconnect structure layer 150 may include 8 metal layers or more, such as 10 metal layers or more, depending on the application.

The metal lines 152 and 156 are situated in the dielectric layers 158 and 162, respectively, and extend in a first direction. The metal line 154 is situated in the dielectric layer 160 and extend in a second direction. By way of example but not limitation, the first direction in which the metal lines 152 and 156 extend is perpendicular to the longitudinal direction of the fin 102, and can be perpendicular to the second direction in which the metal line 154 extends. However, it is contemplated that the metal lines 152 and 156 can extend in a direction parallel to the longitudinal direction of the fin 102 without departing from the spirit and scope of the present disclosure.

In some embodiments, a conductive via 164 can be formed in the dielectric layer 158 and aligned with the metal line 154 to provide electrical connection (as indicated by hatched areas 157) between the metal line 154 and the replacement gate stack 133. A portion of the metal line 152 may be in contact with the metal line 154 (as indicated by hatched area 153), and a portion of the metal line 154 may be in contact with the metal line 156 (as indicated by hatched area 155). In some cases, an additional dielectric layer (not shown) may present between the metal lines 152 and 154, and between the metal lines 154 and 156, respectively, and the metal lines 152, 154, and 156 may be electrically connected through a respect conductive via (not shown) that is formed in such dielectric layers and aligned with the metal lines 152 and 154 or metal lines 154 and 156. It should be understood that more or less metal lines and/or dielectric layers may present in the interconnect structure layer 150, depending on the application. In some cases, the metal lines and conductive vias are configured such that elements of the transistors (e.g., epitaxy features 128 at the drain region 114a and the gate electrode 140 of the replacement gate stack 133) are electrically connected with solder balls or bonding pads that may be found in a back-end packaging structure (not shown) through metal lines (e.g., metal lines 152, 154, 156).

At operation 222, once the interconnect structure layer 150 is formed, a carrier wafer 166 is temporarily bonded to a top side of the interconnect structure layer 150, as shown in FIG. 12. The carrier wafer 166 serves to provide mechanical support for the interconnect structure layer 150 and the transistor structure layer 148 so as to facilitate backside processing of the transistor structure layer 148.

Figure 13:
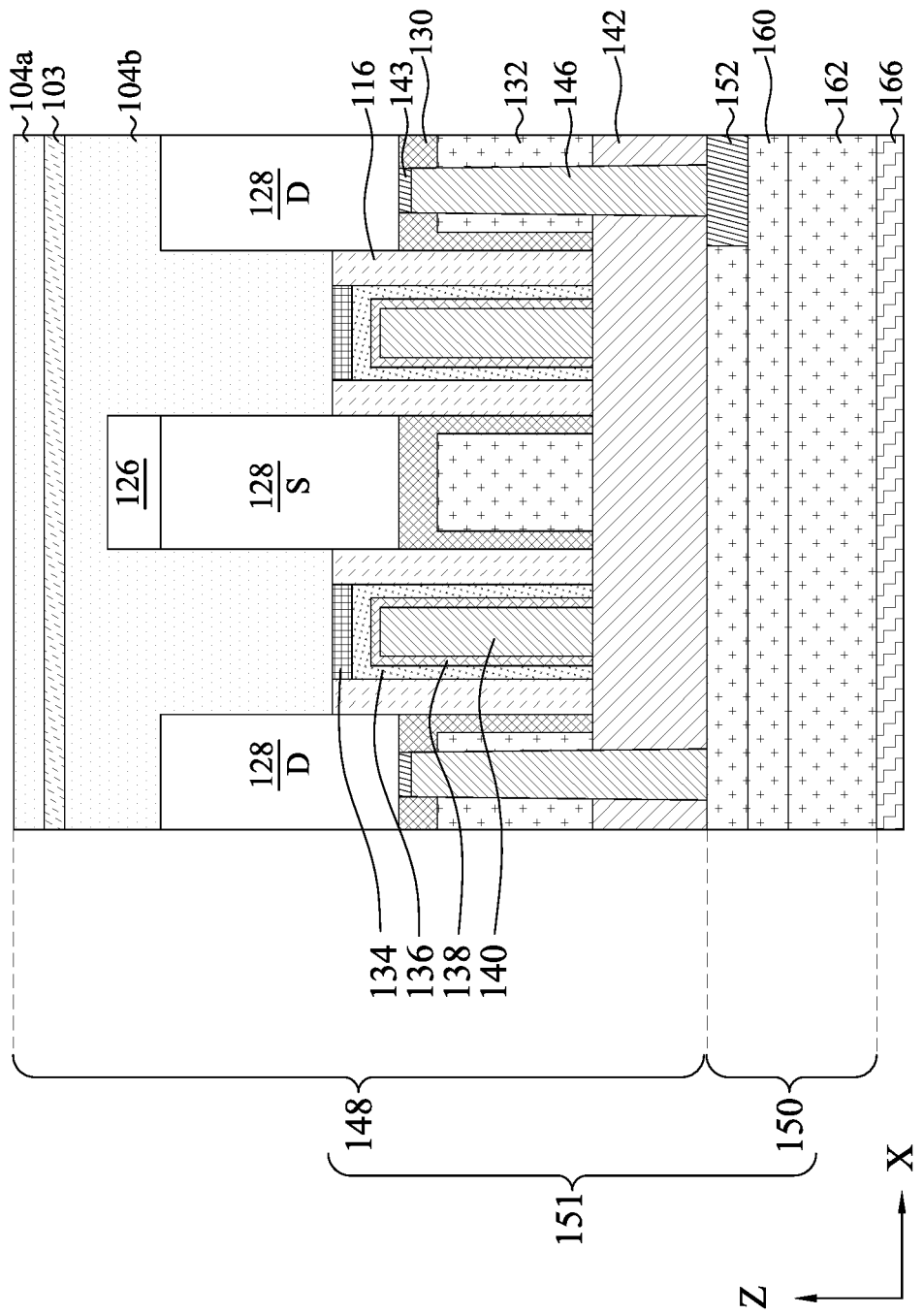
FIGS. 13-25 are cross-sectional views of the FinFET device taken along the line A-A in FIG. 12 during various stages of backside processing of the transistor structure layer.

At operation 224, the carrier wafer 166 is flipped over so that the backside of the substrate 104 is facing up, as shown in FIG. 13. FIGS. 13-25 are cross-sectional views of the device wafer 151 taken along the line A-A in FIG. 12 during various stages of backside processing of the transistor structure layer 148.

Figure 14:
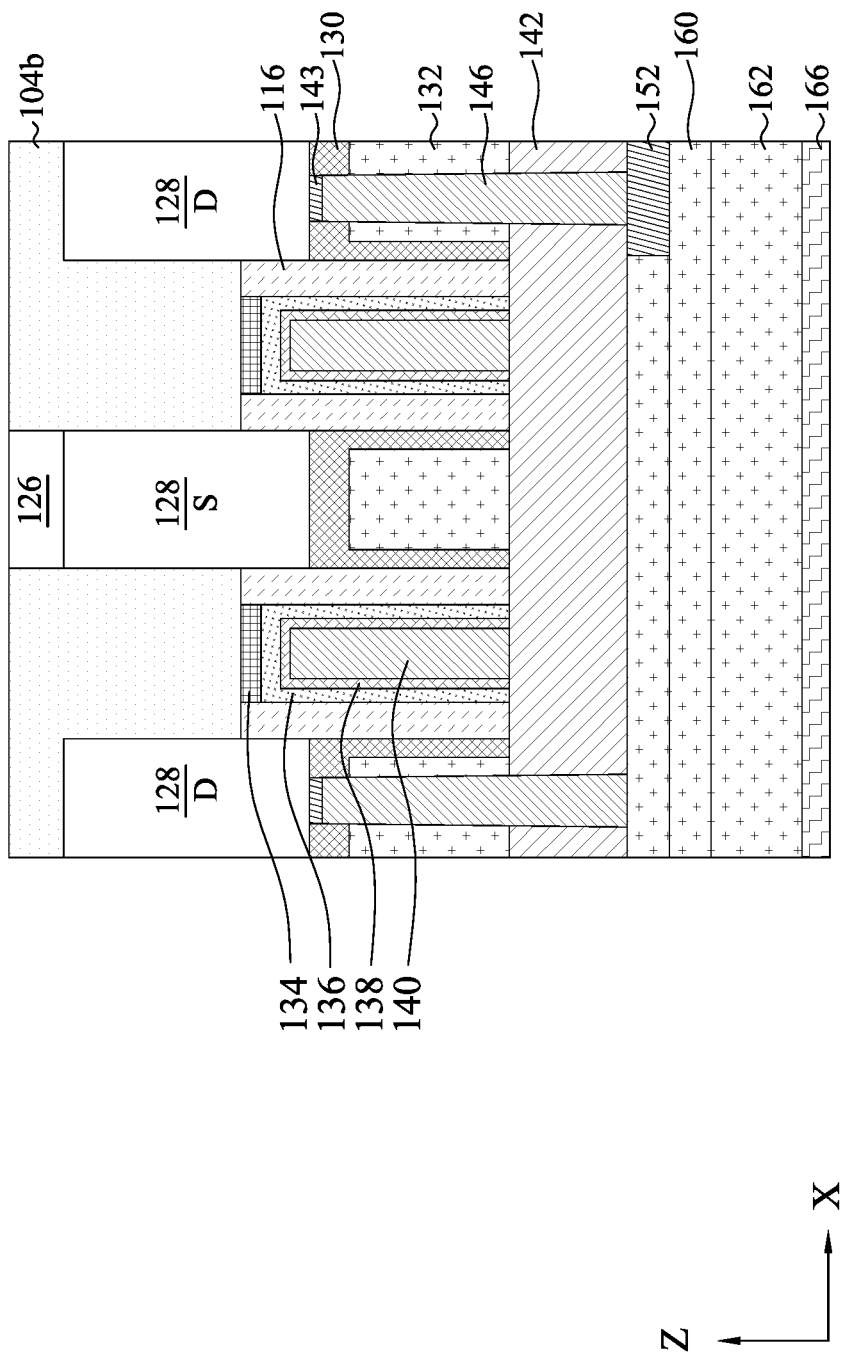

At operation 226, a planarization process, such as a CMP, is performed to remove portions of the substrate 104 on the backside, as shown in FIG. 14. The planarization process may be a two-stage process in which the first silicon portion 104a is removed to expose the insulator 103 during the first stage of the planarization process, and then the insulator 103 and portions of the second silicon portion 104b are removed to expose a top surface of the sacrificial layer 126 during the second stage of the planarization process. The top surface of the sacrificial layer 126 and the top surface of the second silicon portion 104b are generally co-planar upon completion of the planarization process.

Figure 15:
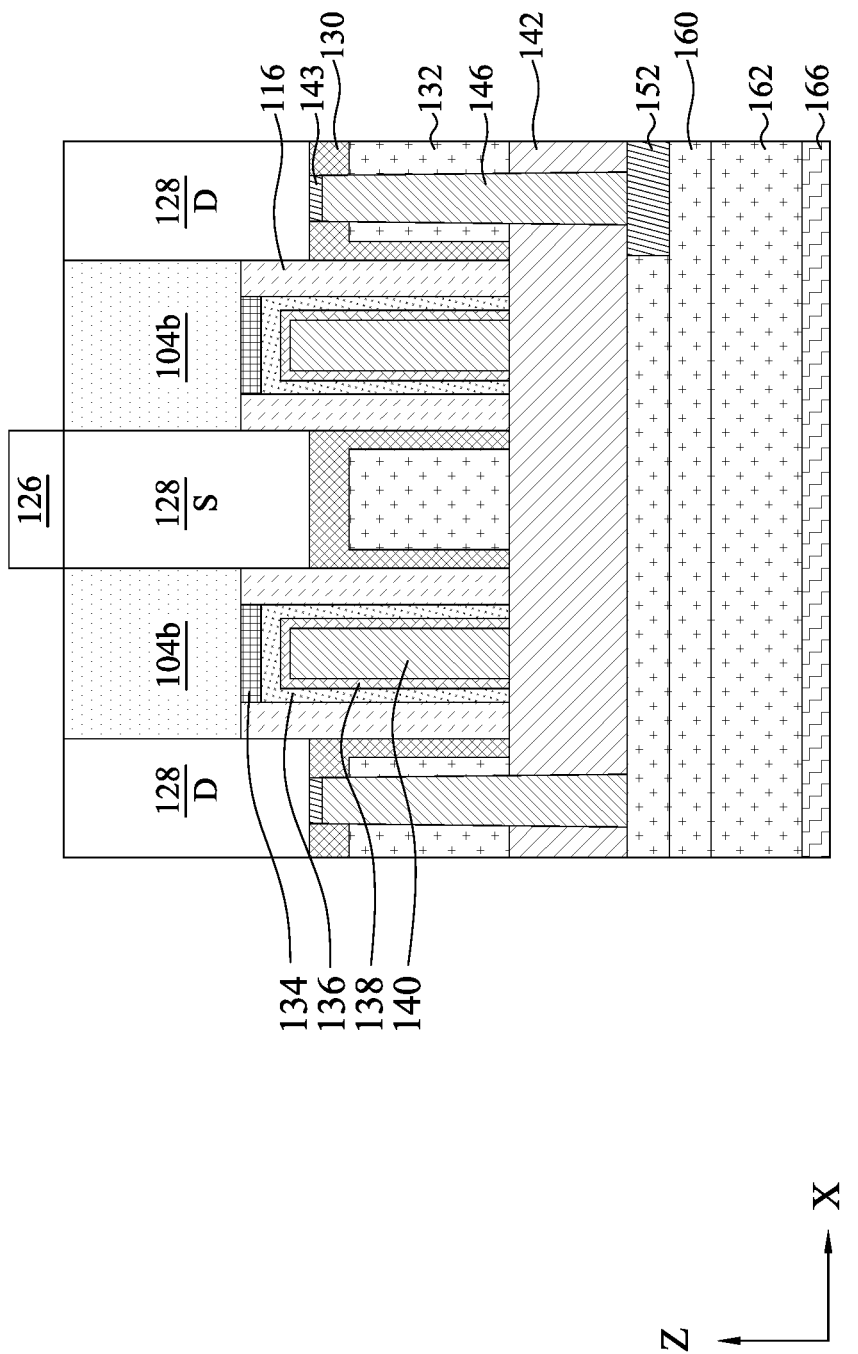

At operation 228, portions of the second silicon portion 104b are further removed using an etch process. The etch process may be an anisotropic etch process or a wet etch process selective to the second silicon portion 104b. The etch process may be continued until the top surfaces of the epitaxy features 128 at drain regions are exposed, as shown in FIG. 15. In one embodiment, the second silicon portion 104b is etched so that the top surfaces of the second silicon portion 104b and the top surfaces of the epitaxy features 128 are co-planar, leaving the sacrificial layer 128 intact. Suitable etch process may include a RIE, NBE, a wet etch, or any suitable etch process.

At operation 230, a first liner layer 168 is deposited on the exposed surfaces of the sacrificial layer 126, the epitaxy features 128, and the second silicon portion 104b. In some embodiments, the first liner layer 168 is a conformal layer. A conformal layer is defined herein as a layer having a thickness variation of about 3% or less, such as about 1% or less. The first liner layer 168 can include nitrogen or be formed of a nitride-based material, such as silicon nitride, or a silicon nitride-based material, such as silicon oxynitride (SiON), silicon carbon nitride (SiCN), silicon carbon oxynitride (SiCON), or any combinations thereof. Other liner material, such as carbon-free silicon oxide, silicon oxycarbide (SiOC), or silicon carbide (SiC), may also be used. In one embodiment, the first liner layer 168 is silicon nitride. The first liner layer 168 may have a substantial uniform thickness of about 20 Å to about 200 Å, such as about 50 Å to about 150 Å. As will be discussed in more detail below, portions of the first liner layer 168 are removed to form air gaps. Therefore, the thickness of the first liner layer 168 may define the size of the air gaps. If the thickness of the first liner layer 168 is less than 20 Å, the air gap may be insufficient to isolate any conductive features (e.g., the conductive feature 172) formed thereabove from the neighboring channel regions 141 during operation. On the other hand, if the thickness of the first liner layer 168 is greater than 200 Å, the manufacturing cost is increased without significant advantage. The first liner layer 168 can be formed by, for example, ALD, CVD, PVD, PECVD, remote plasma CVD, or any suitable deposition technique.

Figure 16:
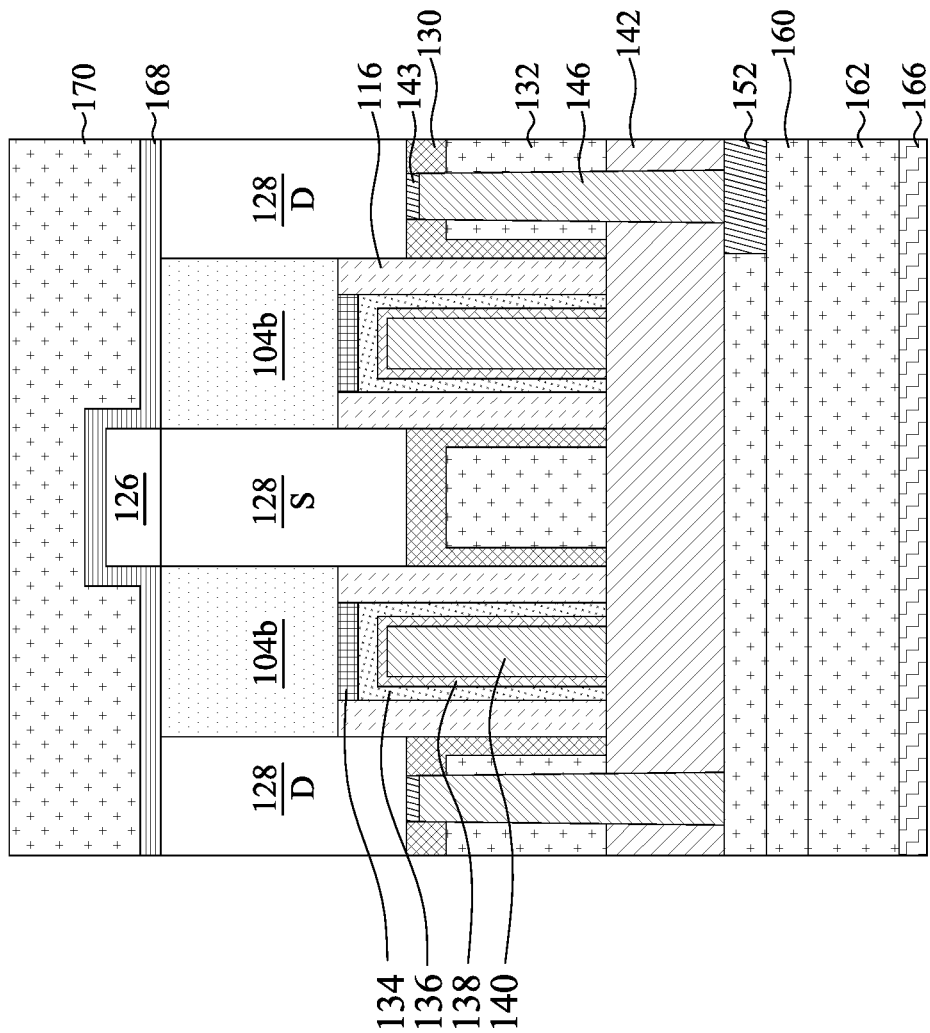

After the first liner layer 168 is deposited on the exposed surfaces of the sacrificial layer 126, the epitaxy features 128, and the second silicon portion 104b, an oxide layer 170 is deposited on the first liner layer 168, as shown in FIG. 16. The oxide layer 170 may include or be a silicon oxide, a material convertible to a silicon oxide, a silicate glass (USG), an alkoxysilane compound (e.g., tetraethoxysilane (TEOS), tetramethoxysilane (TMOS)), thermal oxide, or any suitable dielectric material, or any combination thereof, and can be formed by FCVD, a spin-on coating process, or any suitable deposition technique.

Figure 17:
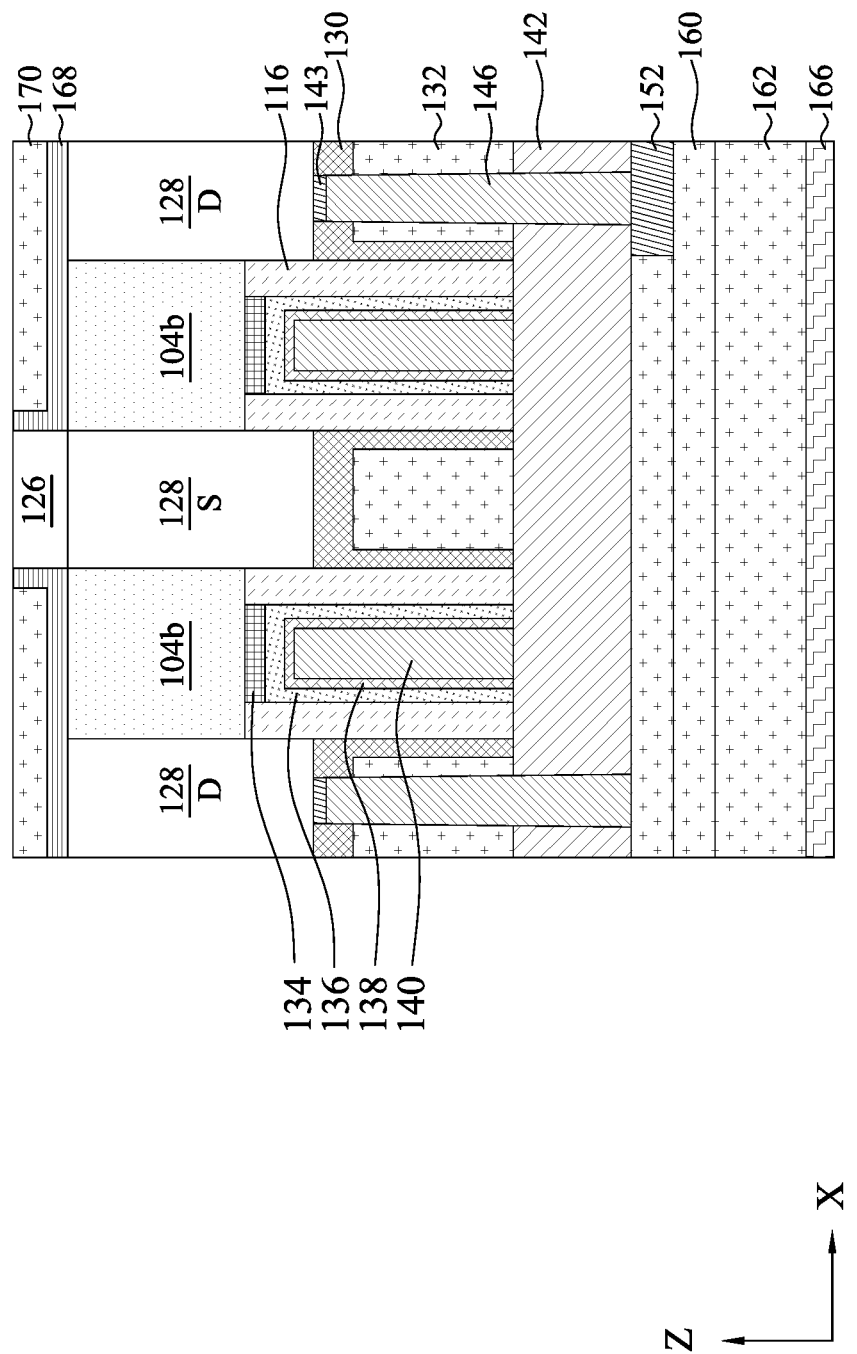

At operation 232, a planarization process, such as a CMP and/or an etch-back process, is performed to remove portions of the oxide layer 170 and the first liner layer 168 disposed above the sacrificial layer 126. The planarization process is performed until a top surface of the sacrificial layer 126 is exposed. After the planarization process, the top surface of the sacrificial layer 126 is substantially level with the top surfaces of the first liner layer 168 and the oxide layer 170, as shown in FIG. 17.

Figure 18:
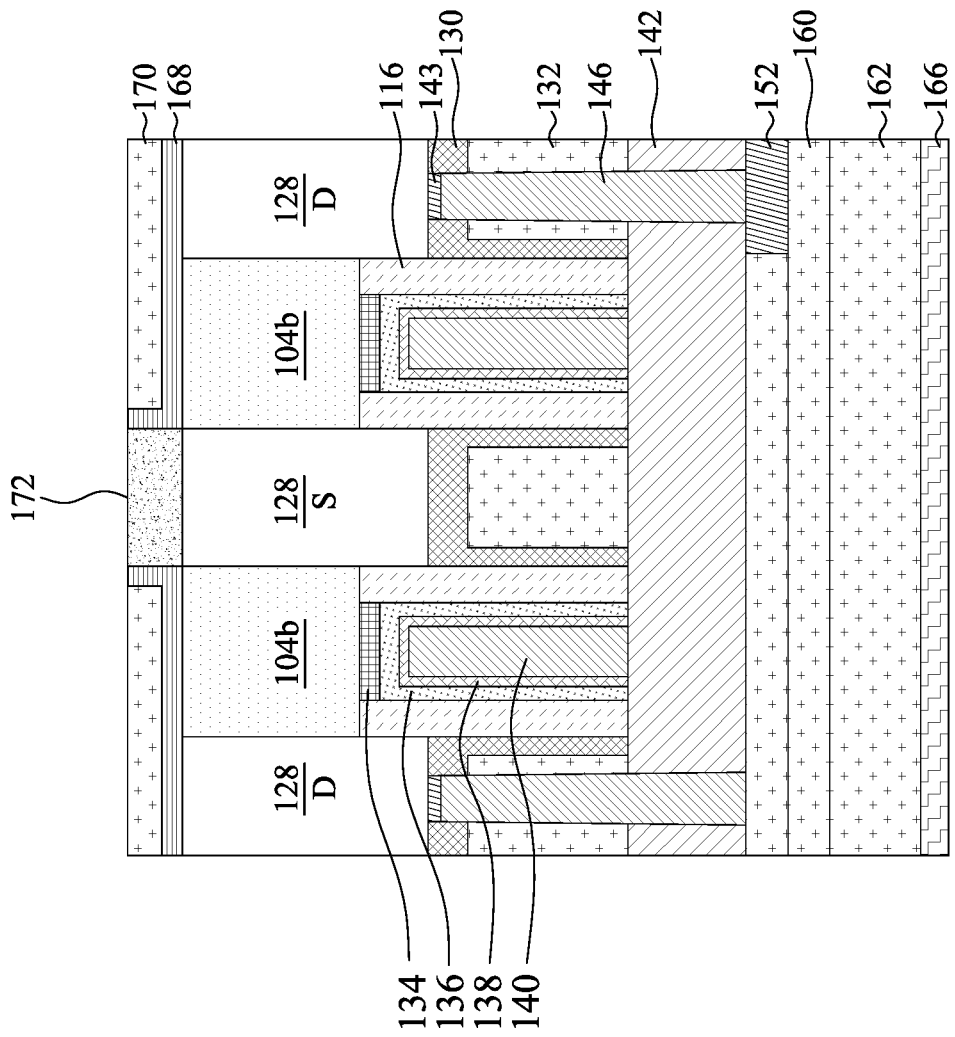

At operation 234, the sacrificial layer 126 is removed and a conductive layer is filled in the region formed where the sacrificial layer 126 was removed to form a conductive feature 172, as shown in FIG. 18. The conductive layer may be any suitable electrical conductive material, for example, tungsten, ruthenium, cobalt, titanium, tantalum, molybdenum, nickel, aluminum, copper, gold, silver, alloys thereof, or the like, and may be deposited by CVD, ALD, PVD, or any suitable deposition technique. The conductive feature 172 can be a via intended to provide an electrical communication between a subsequently formed backside power rail (e.g., power rails 179, 187 shown in FIGS. 20 and 25, respectively) and the epitaxy feature 128 at the source region/terminal "S". A planarization process may be performed to remove excess conductive feature 172 so that top surfaces of the conductive feature 172, the first liner layer 168, and the oxide layer 170 are co-planar.

Figure 19A:
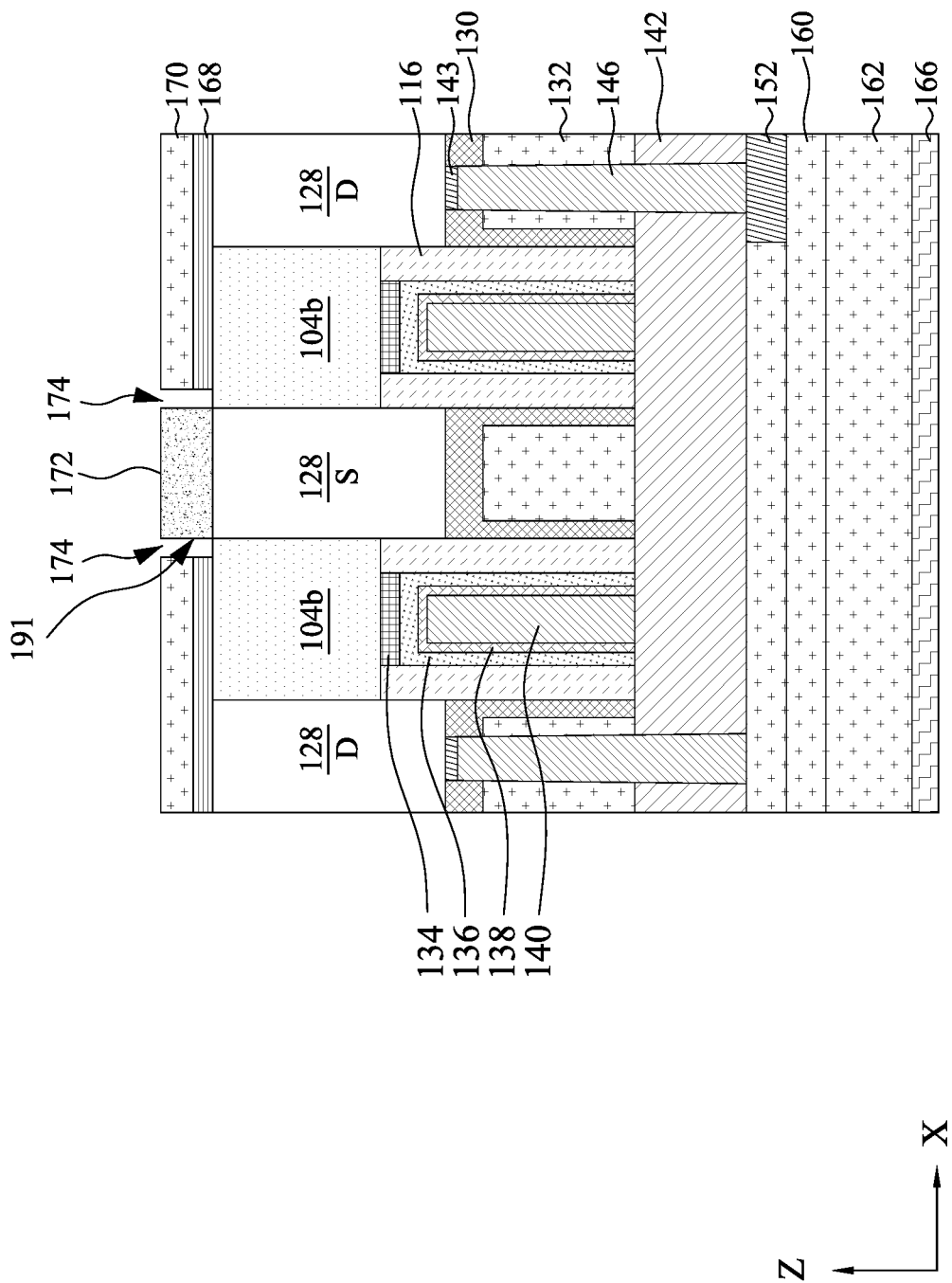

At operation 236, an etch process is performed to selectively remove portions of the first liner layer 168, resulting in air gaps formed in the regions where the portions of the first liner layer 168 were removed. In some embodiments, the first liner layer 168 on the sidewalls 191 of the conductive feature 172 is removed, thereby forming air gaps 174 at regions between the conductive feature 172 and the oxide layer 170, as shown in FIG. 19A. In other words, the sidewalls 191 of the conductive feature 172 are enclosed by the air gaps 174. Since the first liner layer 168, the oxide layer 170, the conductive feature 172, and the second silicon portion 104b have different etch selectivity to an etchant, the etch process can selectively remove the first liner layer 168 without substantially etching the oxide layer 170, the conductive feature 172, and the second silicon portion 104b. The air gaps 174 can effectively reduce a leakage current that may otherwise flow as a result of coupling capacitance formed between the conductive feature 172 and the neighboring channel regions 141 during operation. As a result, the performance of the semiconductor devices is improved.

Figure 19B:
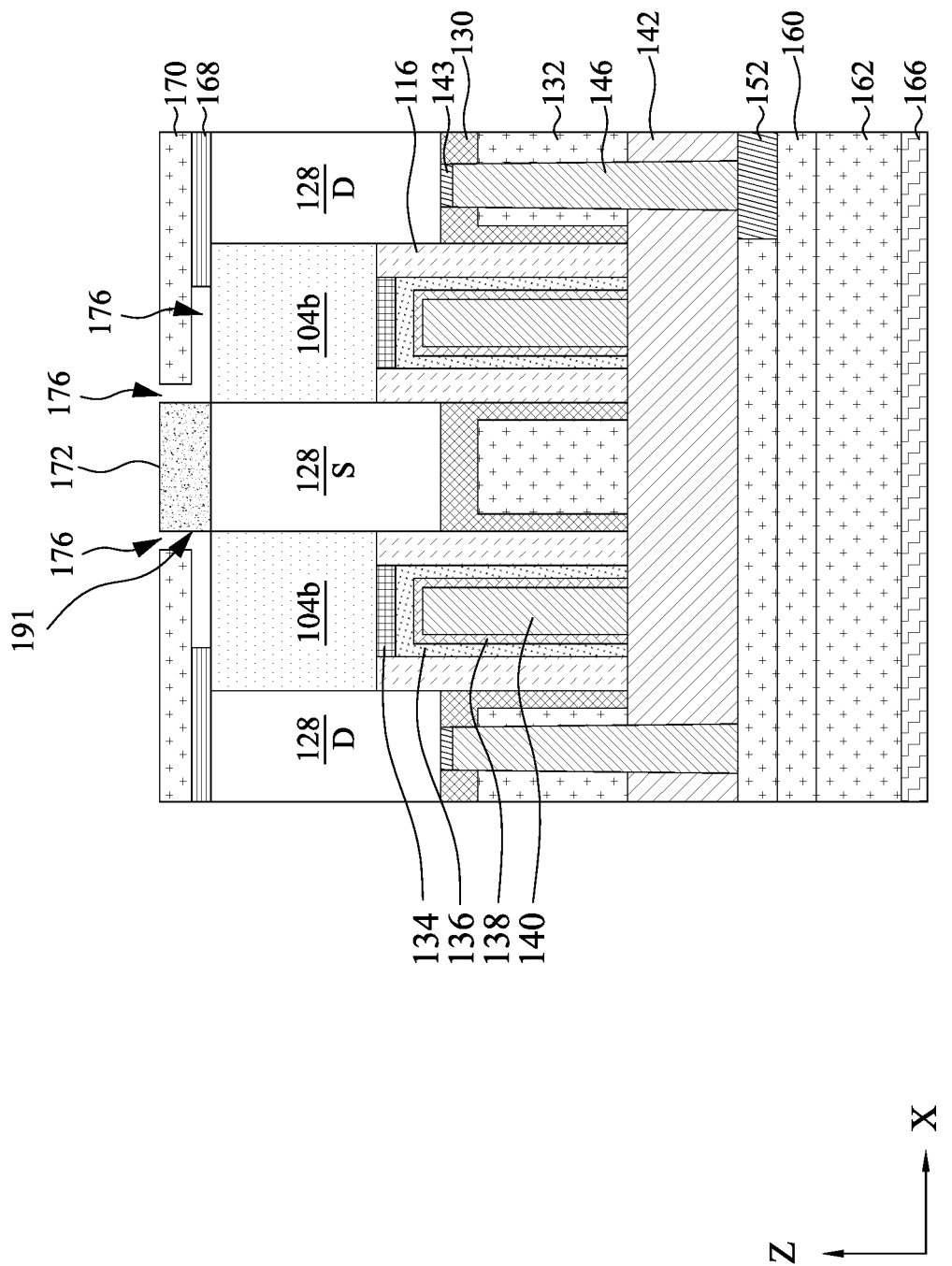

In some embodiments, in addition to the portions of the first liner layer 168 formed on the sidewalls 191 of the conductive feature 172, portions of the first liner layer 168 over the second silicon portion 104b are also removed, thereby forming air gaps 176 at regions between the conductive feature 172 and the oxide layer 170, and between the second silicon portion 104b and the oxide layer 170, as shown in FIG. 19B. In some embodiments, the air gaps 176 generally have a L-shaped profile with respect to a cross-sectional view (in the ZX plane). In one aspect, the first liner layer 168 overlaps the epitaxy features 128 and portions of the second silicon portion 104b with respect to a plain view.

Figure 19C:
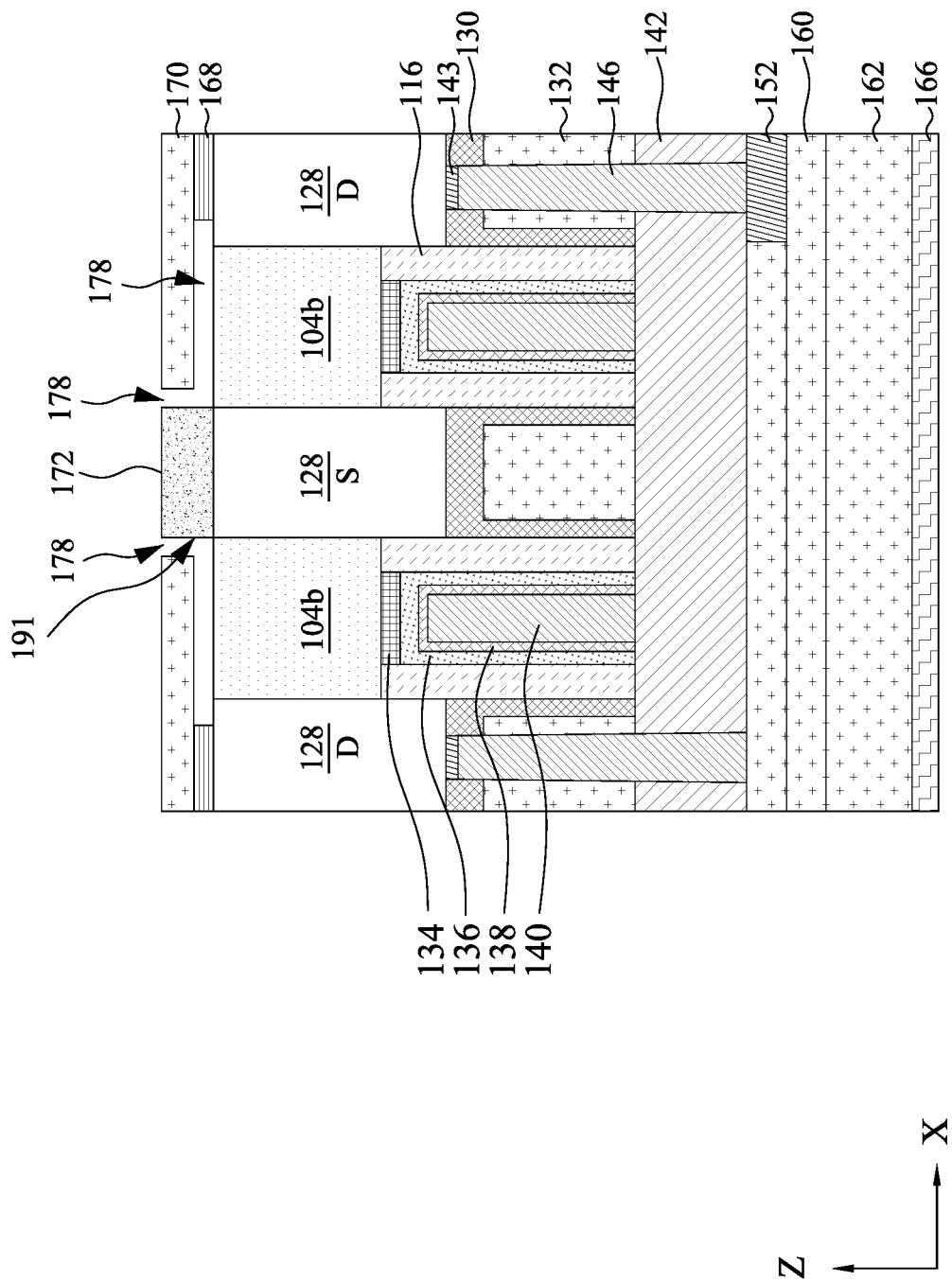

In some embodiments, in addition to the portions of the first liner layer 168 formed on the sidewalls 191 of the conductive feature 172, portions of the first liner layer 168 over the second silicon portion 104b and portions of the first liner layer 168 over the epitaxy features 128 are further removed, thereby forming air gaps 178 at regions between the conductive feature 172 and the oxide layer 170, between the oxide layer 170 and the second silicon portion 104b, and between the oxide layer 170 and portions of the epitaxy features 128, as shown in FIG. 19C. In some embodiments, the air gaps 178 generally have a L-shaped profile with respect to a cross-sectional view (in the ZX plane). In one aspect, the first liner layer 168 overlaps portions of the epitaxy features 128 with respect to a plain view.

Figure 19D:
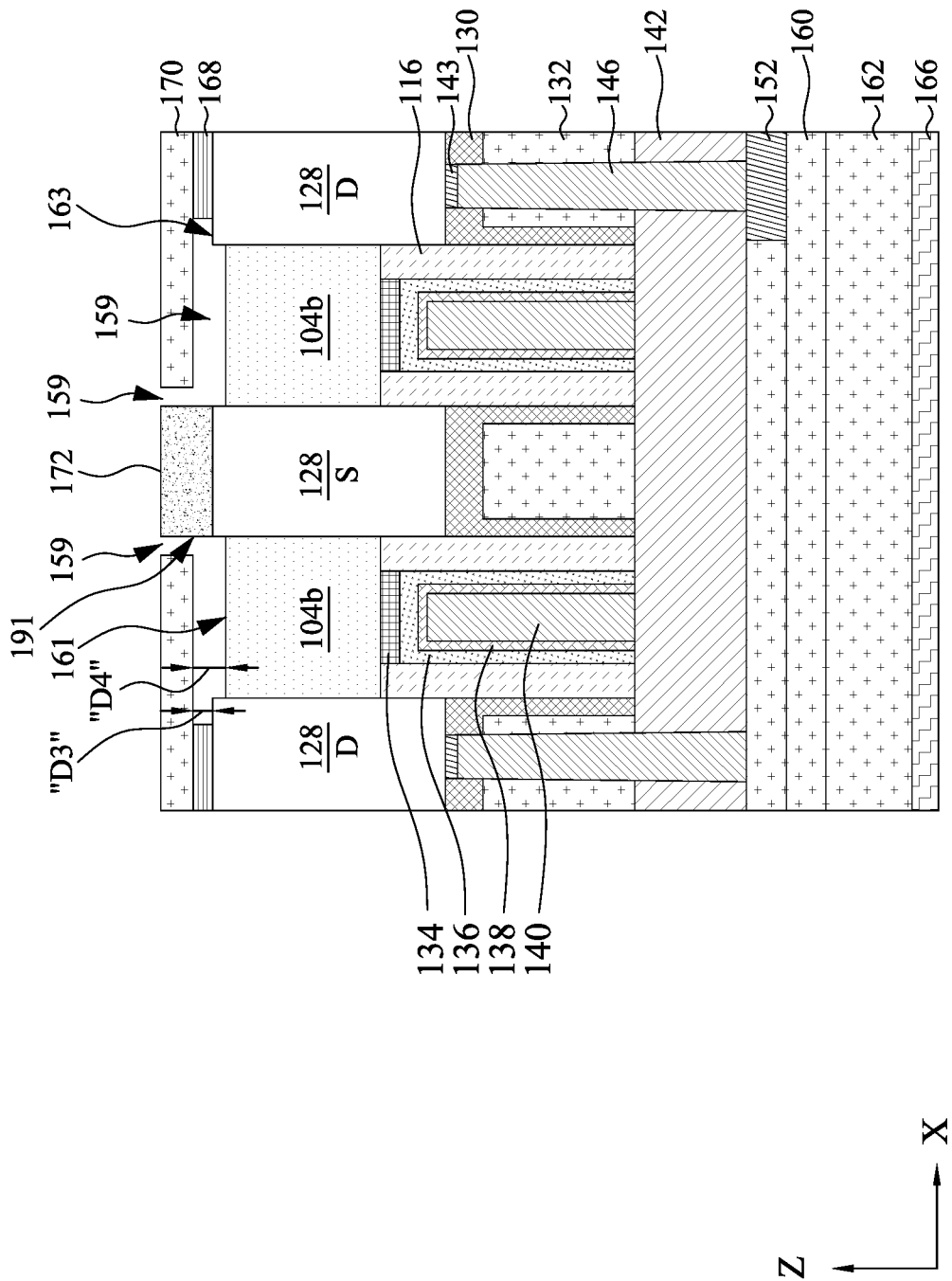

In some embodiments, a portion of the second silicon portion 104b may be over-etched during the removal of the first liner layer 168. In such a case, portions of a sidewall surface of the epitaxy feature 128 at the source region/terminal "S" may be exposed due to the recess of the second silicon portion 104b. Therefore, a bottom surface 161 of the second silicon portion 104b is not co-planar with a bottom surface 163 of the epitaxy feature 128 at the drain region/terminal "D" and a bottom surface 165 of the epitaxy feature 128 at the source region/terminal "S", as shown in FIG. 19D. In one aspect, the air gaps 159 formed as the result of removing portions of the first liner layer 168 and the second silicon portion 104b have a first dimension "D3" (located between the oxide layer 170 and the epitaxy feature 128 at the drain region/terminal "D" and a second dimension "D4" (located between the oxide layer 170 and the second silicon portion 104b), wherein the second dimension "D4" is greater than the first dimension "D3".

Figure 19E:
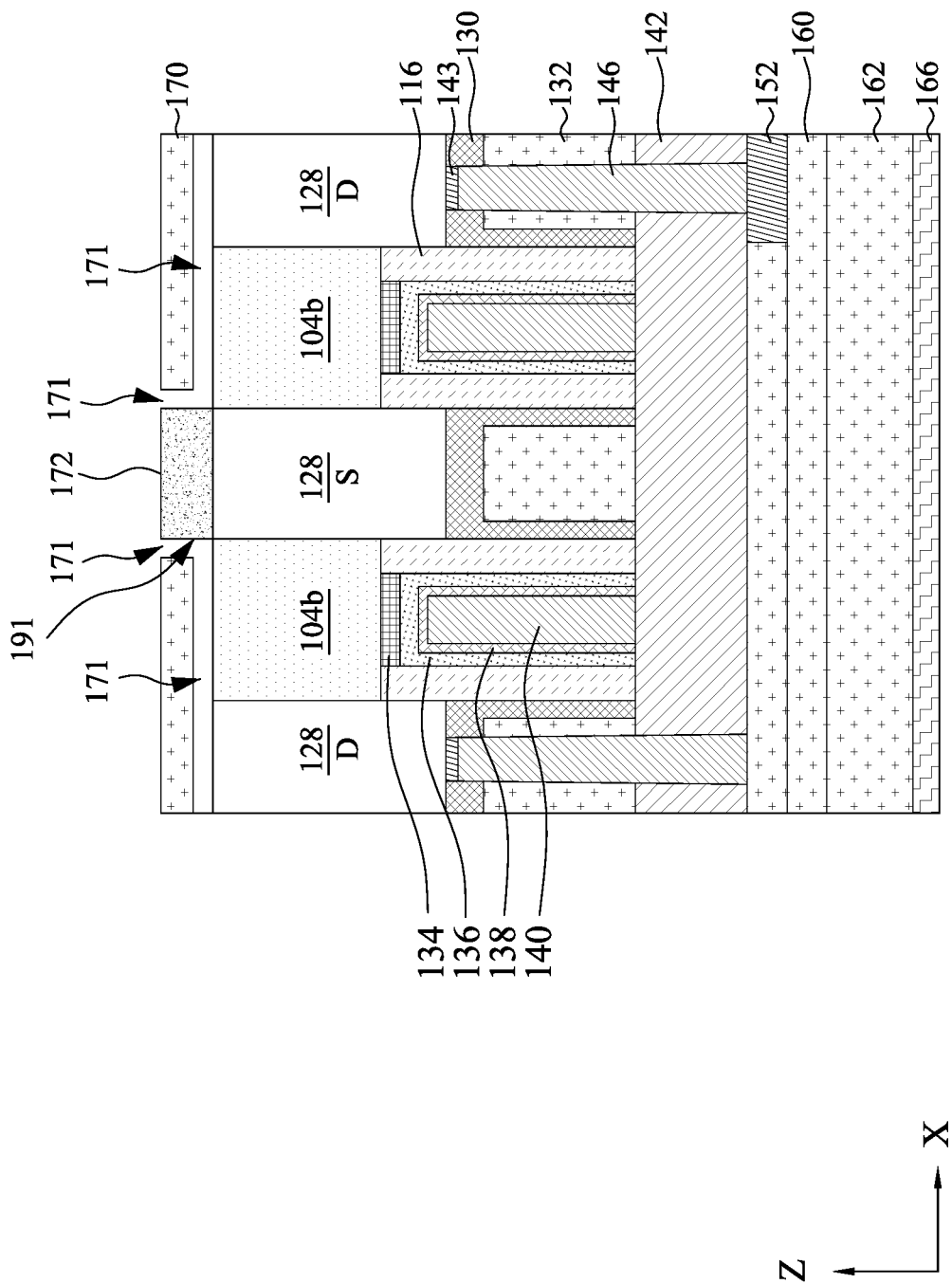

In some embodiments, the entire portion of the first liner layer 168 is removed, thereby forming air gaps 171 at regions where the first liner layer 168 was removed, as shown in FIG. 19E. In such a case, the oxide layer 170, the epitaxy features 128, and the second silicon portion 104b are directly exposed to the air gaps 171. In one aspect, the air gaps 171 generally have a L-shaped profile with respect to a cross-sectional view (in the ZX plane).

The air gaps (e.g., air gaps 174, 176, and 178) can be formed by any suitable etchant in a liquid or gaseous state. In various embodiments, a wet etch process is used to selectively remove the first liner layer 168. As the first liner layer 168 (e.g., silicon nitride), the oxide layer 170, and the conductive feature 172 have different etch selectivity, the exposed portion of the oxide layer 170 and the conductive feature 172 would not be etched (or etched at a much slower etch rate) when the exposed portion of the first liner layer 168 is etched. This means that the exposed portion of the first liner layer 168 can be selectively etched. In some embodiments, the chemical of the etchant can have an etch selectivity of the first liner layer 168 to the oxide layer 170 of about 50:1 to about 80:1 or more, for example about 100:1 or more, such as about 100:1 to about 200:1. The etchant selected do not substantially etch or damage the oxide layer 170 and the conductive feature 172 to a degree that might adversely affect the reliability of the backside contact structure. The remaining first liner layer 168 (e.g., first liner layer 168 over the epitaxy features at drain regions "D") that is not removed can still provide mechanical support for the oxide layer 170.

In addition, the formation of air gaps can also be controlled by etching time. When the etching time is short, the first liner layer 168 over the sidewalls 191 of the conductive feature 172 will be removed, as the embodiment shown in FIG. 19A. When the etching time becomes longer, the first liner layer 168 over the second silicon portion 104b and the epitaxy features 128 will also be removed. The longer the etching time, the greater consumption of the first liner layer 168. As a result, air gaps can extend further to regions between the conductive feature 172 and the oxide layer 170, between the oxide layer 170 and the second silicon portion 104b, or even between the oxide layer 170 and the epitaxy features 128, as the embodiments shown in FIGS. 19B and 19C.

An exemplary etch process may include exposing at least the backside of the substrate 104 to a hydrofluoric acid (HF) based solution that reacts with and dissolves the first liner layer 168. The HF based solution may be diluted with water. In some cases, the HF based solution may contain about 10% or less of HF acid, for example about 5% or less. In some cases, the HF based solution may contain about 1% concentration of HF acid. The exposure time of the backside of the substrate 104 to the HF based solution may be about 15 second to about 60 minutes, such as about 30 seconds to about 10 minutes, depending on the concentration of the HF based solution used. Other suitable wet etching solutions may include, but are not limited to, ammonium hydroxide ($NH_4OH$), potassium hydroxide (KOH), tetramethylammonium hydroxide (TMAH), or the like, or any combination thereof. The concentration of the HF acid and the exposure time can be adjusted so that the HF based solution does not have significant adverse effects on the oxide layer 170 and the conductive feature 172.

Figure 20:
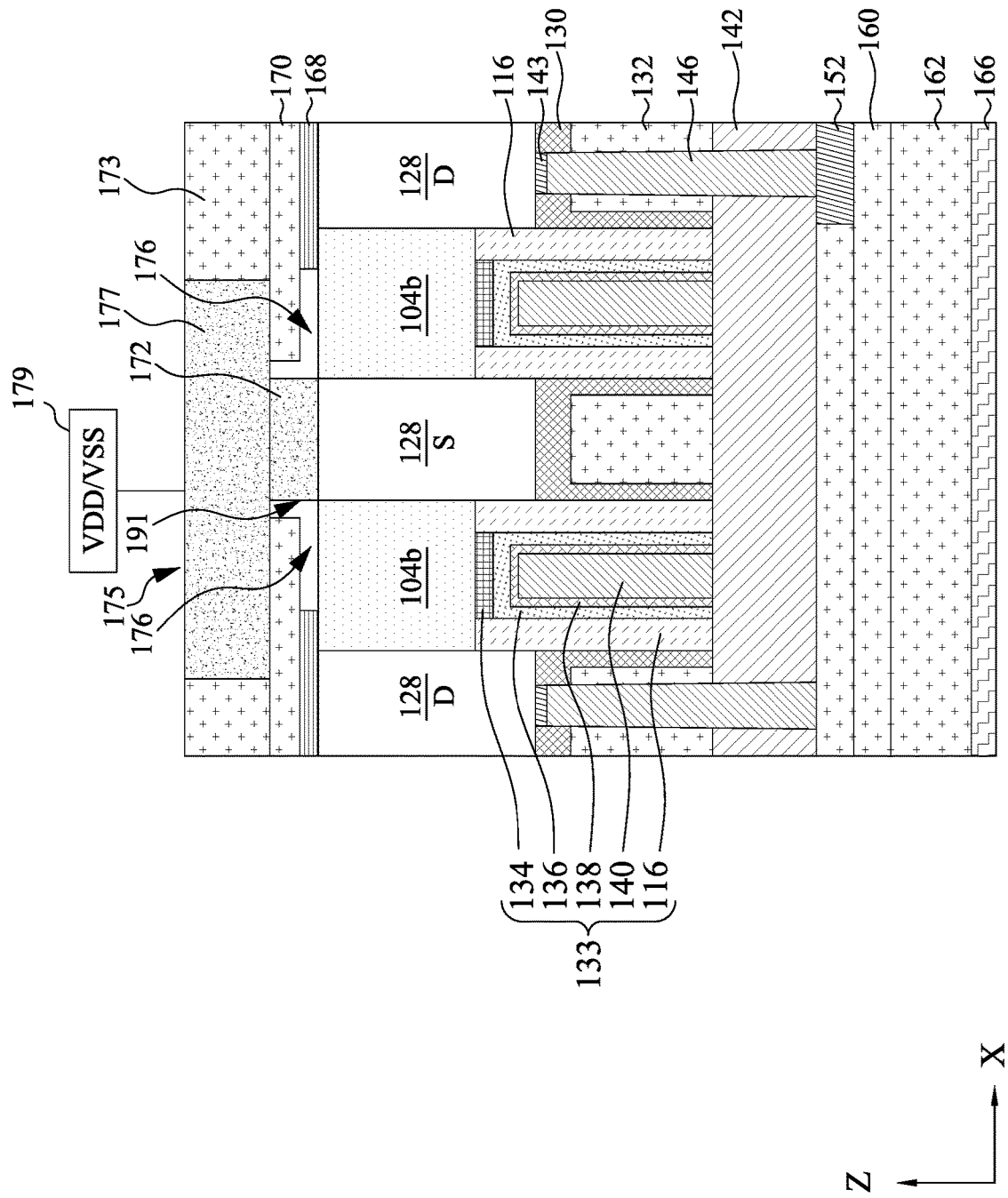

At operation 238, an interlayer dielectric (ILD) 173 is deposited on the top surfaces of the oxide layer 170 and the conductive feature 172, and on the regions of the air gaps 176 enclosing sidewalls 191 of the conductive feature 172, as shown in FIG. 20. The air gaps 176 is discussed herein for illustration purposes and can be replaced with the air gaps 174 or 178. The ILD 173 may be the same material as the first ILD 132 and the second ILD 142, or formed of any suitable dielectric material. After the ILD 173 is deposited, a power rail 175 is provided in the ILD 173 and in contact with the conductive feature 172. The power rail 175 can be formed by selective etching of the ILD 173 (e.g., by an isotropic dry etch or a wet etch process) to create a trench that exposes the top surface of the conductive feature 172. Then, a conductive layer 177, such as the material used for the conductive feature 172, is deposited into the trench until the trench is filled. Alternatively, the power rail 175 can be deposited on the top surfaces of the oxide layer 170 and the conductive feature 172, and on the regions of the air gaps 176 enclosing sidewalls 191 of the conductive feature 172 using a mask, followed by the formation of ILD 173. A planarization process may be performed so that the top surfaces of the conductive layer 177 and the ILD 173 are co-planar.

The power rail 175 is electrically connected to a power supply node 179 that transmits power for the FinFET device 100. Depending on the conductivity type of the device, the power supply node 179 may be fed with a positive voltage (VDD) or a negative voltage (VSS) (i.e., ground or zero voltage). Having the power rail 175 disposed at the backside of the device allows for the FinFET device 100 to be powered directly by a backside power, thereby enhancing the device performance, saving an amount of routing resources used on the front side of the device, and reducing BEOL process complexity without abnormal electrical misconnection issues.

At operation 240, after the power rail 175 is connected to the power supply node 179, the carrier wafer 166 is flipped back so that the backside of the substrate 104 is facing down. The carrier wafer 166 may then be removed from the interconnect structure layer 150.

Figure 21:
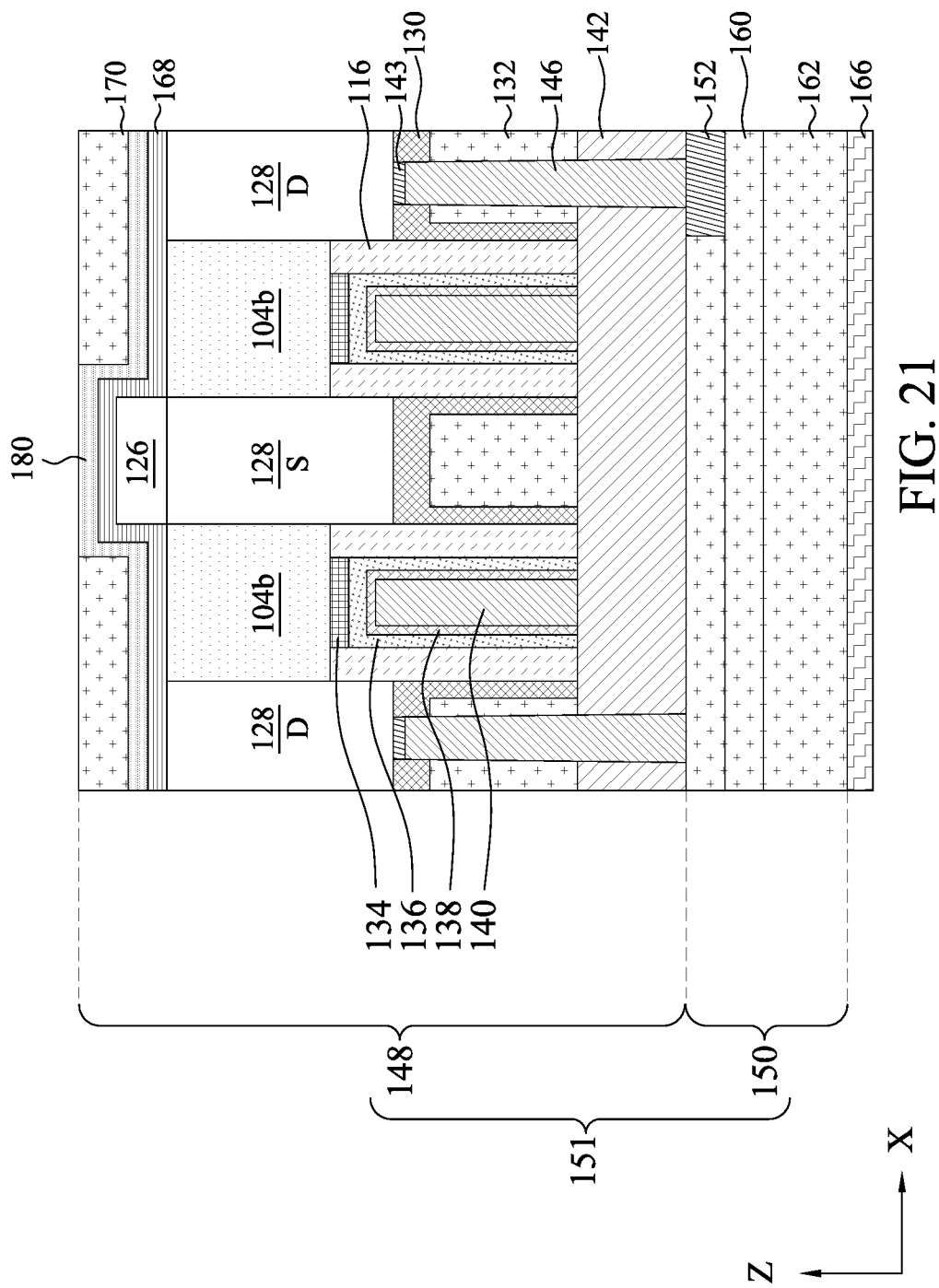

FIG. 21 illustrates a cross-sectional view of the device wafer 151 according to another embodiment of the present disclosure. This embodiment is substantially similar in configuration to the embodiment shown in FIG. 16 except that a second liner layer 180 is conformally deposited on the first liner layer 168 prior to deposition of the oxide layer 170. In one embodiment, the second liner layer 180 may be a silicon liner. The second liner layer 180 may include or be amorphous silicon, polysilicon, or the like, or any suitable material that has an etch selectivity different than the oxide layer 170 and the first liner layer 168. The second liner layer 180 may be doped. The second liner layer 180 may have a substantial uniform thickness of about 20 Å to about 200 Å, such as about 50 Å to about 150 Å. The second liner layer 180 serves to make room for the air gap (e.g., air gap 184 in FIG. 24B) between the oxide layer 170 and the first liner layer 168 when the second liner layer 180 is removed at a later stage. Therefore, if the thickness of the second liner layer 180 is less than 20 Å, there may be insufficient isolation between the conductive feature and neighboring channel regions. On the other hand, if the thickness of the second liner layer 180 is greater than 200 Å, the manufacturing cost is increased without significant advantage. The second liner layer 180 may be formed by using a suitable deposition technique that can form a conformal silicon layer, such as a low temperature chemical deposition process (e.g., about 200° C. to about 550° C.) in a gaseous environment containing a suitable silicon precursor and a carrier gas. Suitable silicon precursors may include, but are not limited to, $SiH_4$, $Si_2H_6$, $Si_3H_8$, $SiCl_2H_2$, $SiCl_3H$, or any combination thereof. Suitable carrier gas may include $H_2$ or He. In cases where a doped second line layer 180 is used, a dopant gas, such as a germanium-containing gas, a boron-containing gas, or the like, can be further provided to the gaseous environment in which the device wafer 151 is disposed.

Figure 22:
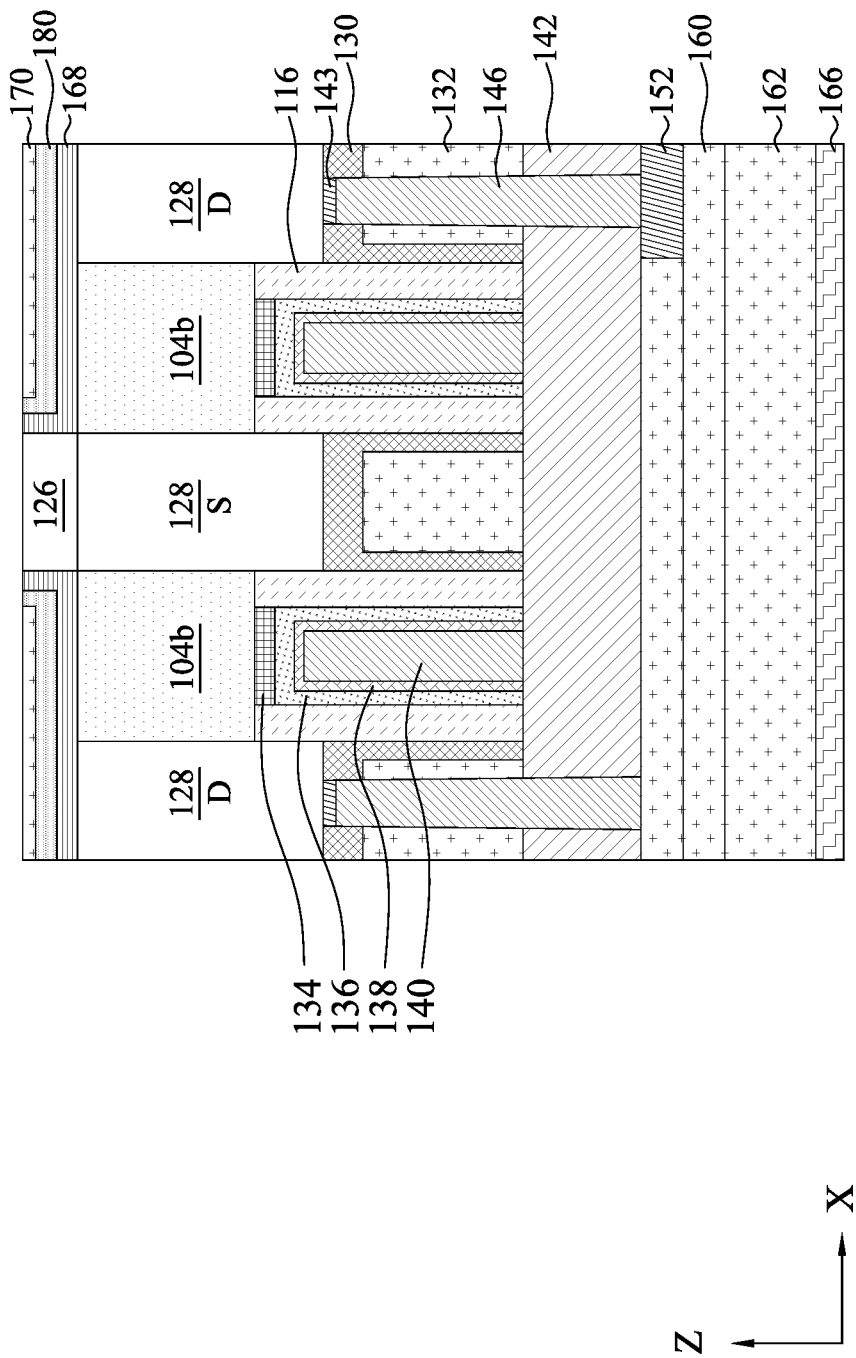
Figure 23:
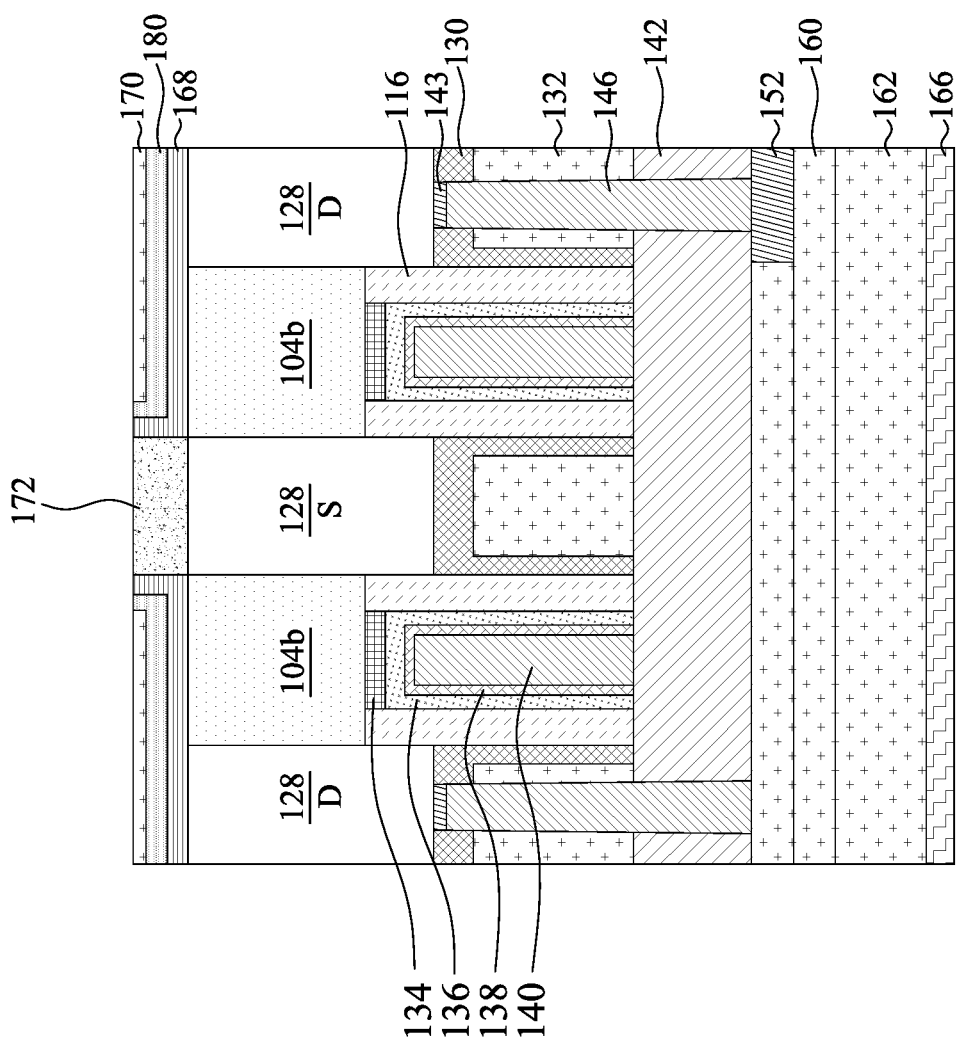

After the second liner layer 180 is formed on the first liner layer 168, an oxide layer, such as the oxide layer 170, is deposited on the second liner layer 180. The device wafer 151 is then subjected to a planarization process to remove portions of the oxide layer 170, the second liner layer 180, and the first liner layer 168 until a top surface of the sacrificial layer 126 is exposed. After the planarization process, the top surface of the sacrificial layer 126 is substantially level with the top surfaces of the first liner layer 168, the second liner layer 180, and the oxide layer 170, as shown in FIG. 22. The sacrificial layer 126 is then removed and a conductive layer, such as the conductive feature 172, is filled in the region formed where the sacrificial layer 126 was removed, as shown in FIG. 23.

Figure 24A:
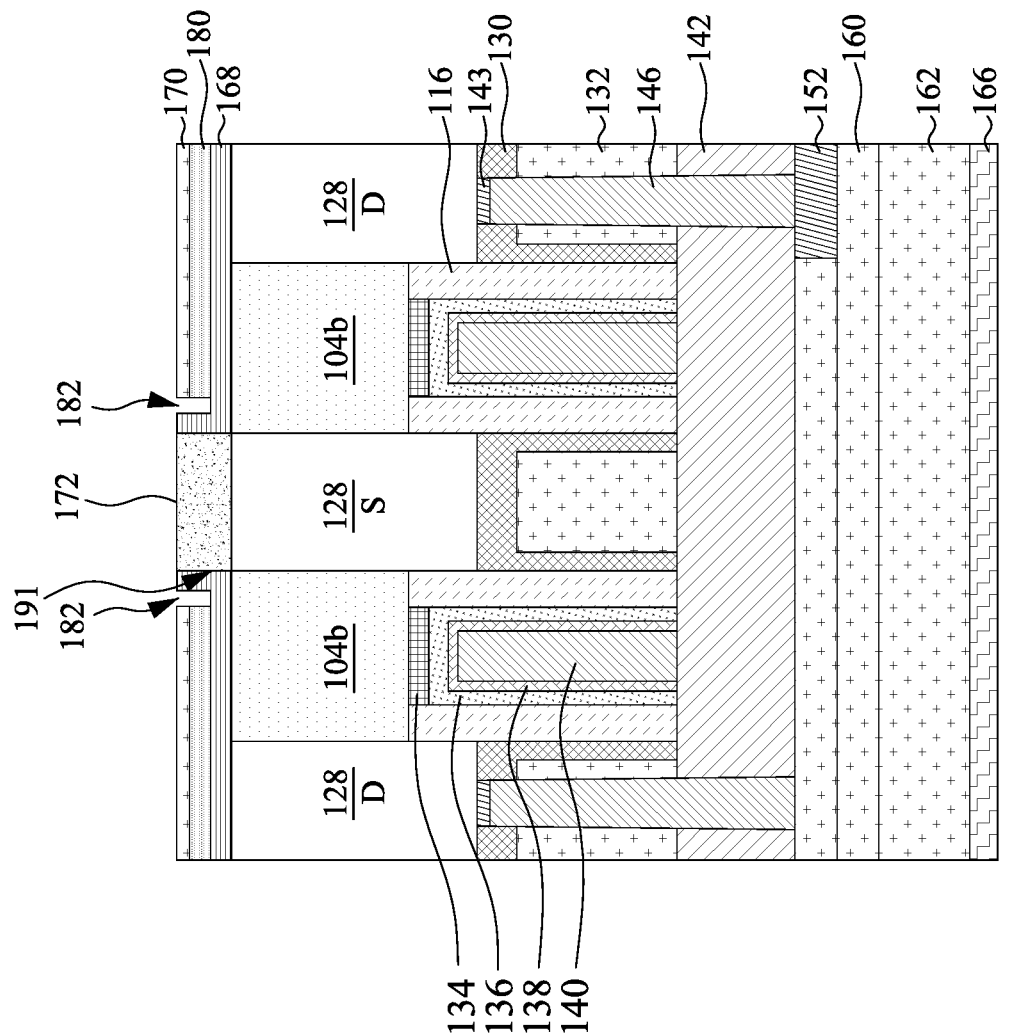

Similar to the embodiments discussed above with respect to FIGS. 19A-19E, an etch process is performed to selectively remove portions of the second liner layer 180, resulting in air gaps formed in the regions where the second liner layer 180 was removed. In some embodiments, portions of the second liner layer 180 formed radially outward of the first liner layer 168 over the sidewalls 191 of the conductive feature 172 are removed, thereby forming air gaps 182 at regions between the oxide layer 170 and the first liner layer 168 over the sidewalls 191 of the conductive feature 172, as shown in FIG. 24A. In other words, the first liner layer 168 over the sidewalls 191 of the conductive feature 172 is enclosed by the air gaps 182.

Figure 24B:
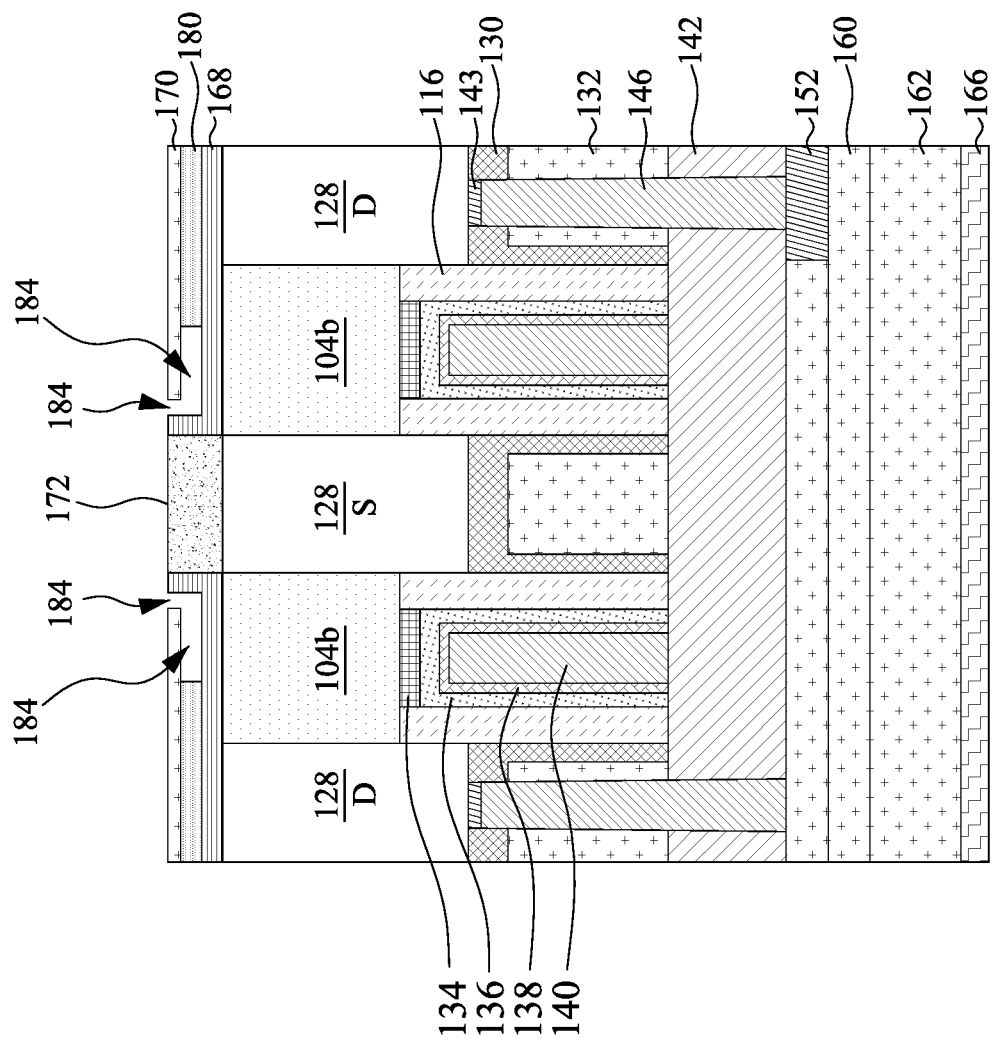

In some embodiments, the portions of the second liner layer 180 formed radially outward of the first liner layer 168 that is over the sidewalls 191 of the conductive feature 172 and portions of the second liner layer 180 formed on the first liner layer 168 that is over the first second silicon portion 104b are removed, thereby forming air gaps 184 at regions between the oxide layer 170 and the first liner layer 168 over the sidewalls 191 of the conductive feature 172, and between the oxide layer 170 and the first liner layer 168 formed over the second silicon portion 104b, as shown in FIG. 24B. In some embodiments, the air gaps 184 generally have a L-shaped profile with respect to a cross-sectional view (in the ZX plane). In one aspect, the second liner layer 180, portions of the first liner layer 168, and the oxide layer 170 are directly exposed to the air gaps 184.

Figure 24C:
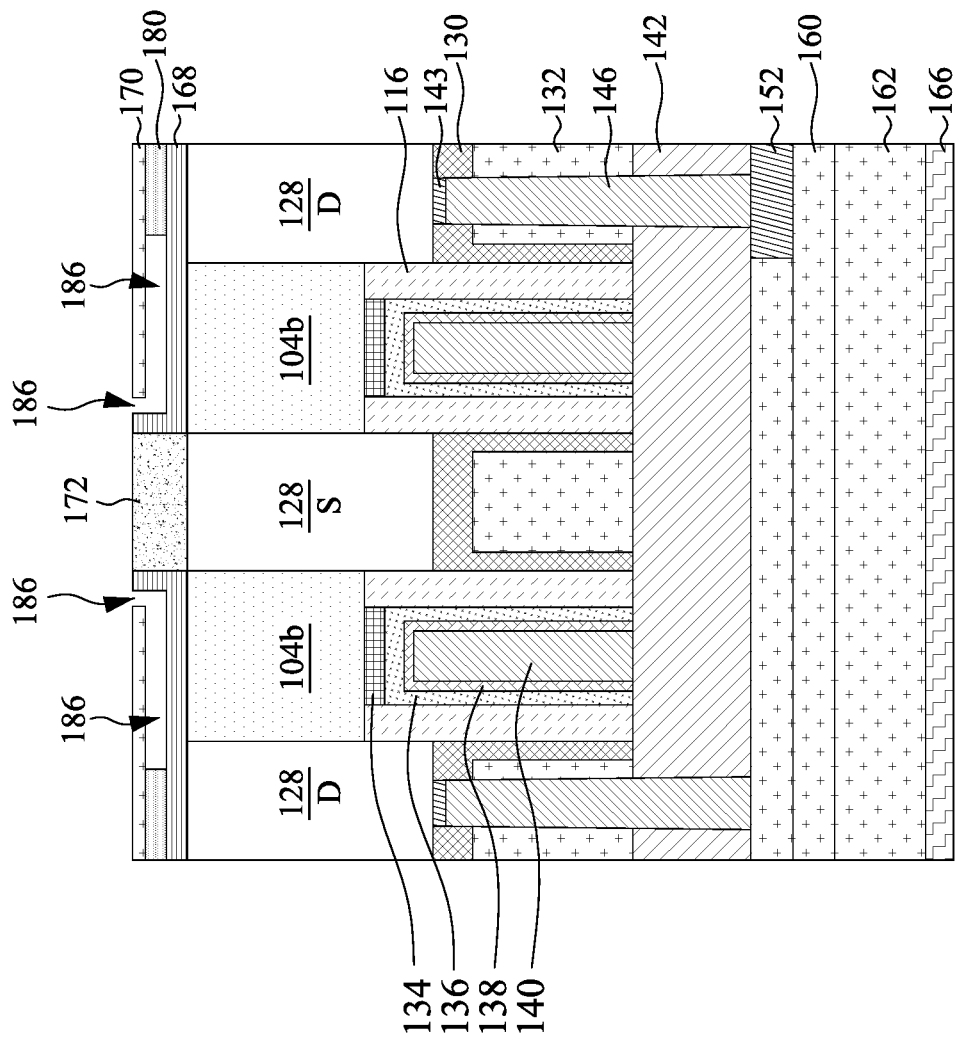

In some embodiments, in addition to the second liner layer 180 formed radially outward of the first liner layer 168 over the sidewalls 191 of the conductive feature 172, the portions of the second liner layer 180 formed on the first liner layer 168 that is over the second silicon portion 104b and portions of the second liner layer 180 that are over the epitaxy features 128 are further removed, thereby forming air gaps 186 at regions between the oxide layer 170 and the first liner layer 168 over the sidewalls 191 of the conductive feature 172, between the oxide layer 170 and the first liner layer 168 formed over the second silicon portion 104b, and between the oxide layer 170 and the first liner layer 168 formed over the epitaxy features 128, as shown in FIG. 24C. In some cases, the oxide layer 170 and the first liner layer 168 are partially separated by the air gaps 186. In some embodiments, the air gaps 186 generally have a L-shaped profile with respect to a cross-sectional view (in the ZX plane). In one aspect, the second liner layer 180, portions of the first liner layer 168, and the oxide layer 170 are directly exposed to the air gaps 186.

Figure 24D:
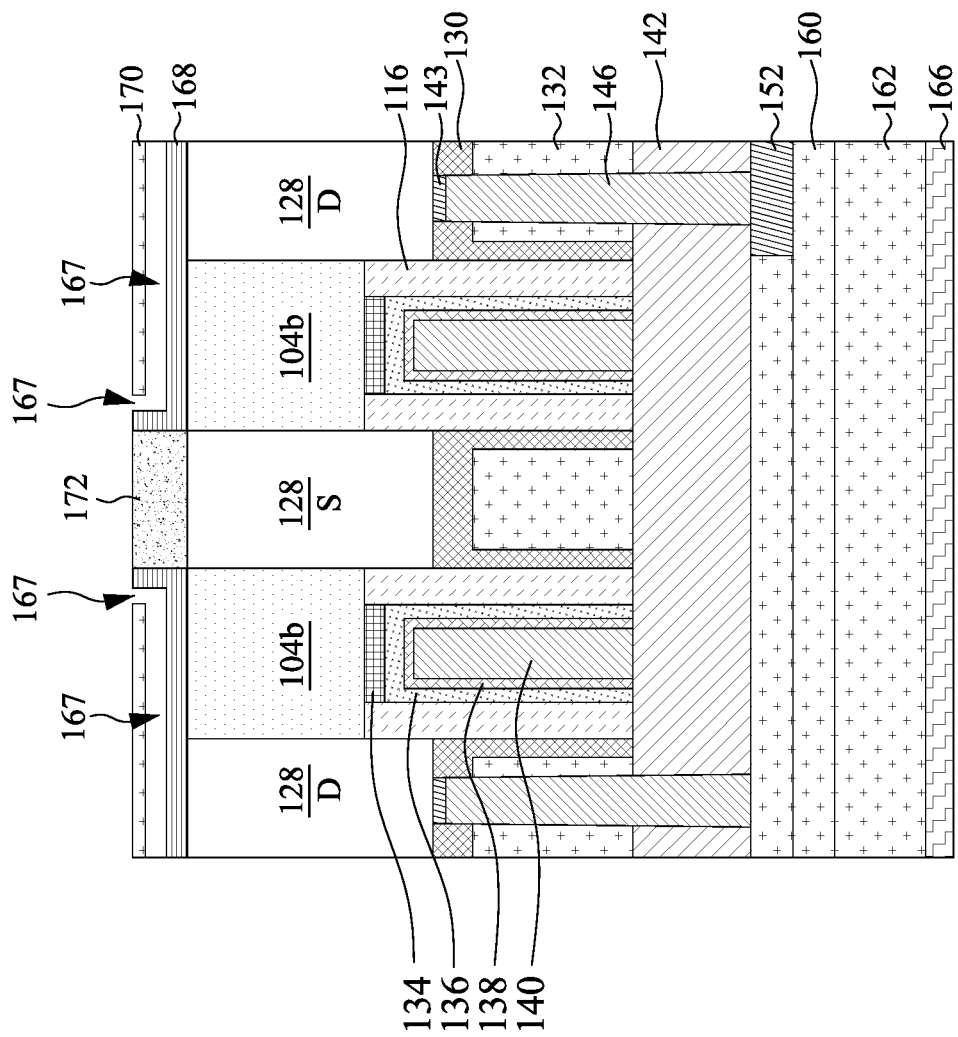

In some embodiments, the entire portion of the second liner layer 180 is removed, thereby forming air gaps 167 at regions where the second liner layer 180 was removed, as shown in FIG. 24D. In such a case, the oxide layer 170 and the first liner layer 168 are directly exposed to the air gaps 167. In one aspect, the air gaps 167 generally have a L-shaped profile with respect to a cross-sectional view (in the ZX plane).

The air gaps (e.g., air gaps 182, 184, and 186) can be formed by any suitable etchant in a liquid or gaseous state. In various embodiments, a wet etch process is used to selectively remove the second liner layer 180. As the second liner layer 180 (e.g., amorphous silicon) has an etch selectivity different than the oxide layer 170, the first liner layer 168 (e.g., silicon nitride), and the conductive feature 172, the exposed portions of the oxide layer 170, the first liner layer 168, and the conductive feature 172 would not be etched (or etched at a much slower etch rate) when the exposed portion of the second liner layer 180 is etched. In some embodiments, the chemical of the etchant can have an etch selectivity of the second liner layer 180 to the oxide layer 170 of about 100:1 or more, such as about 100:1 to about 200:1. The chemical of the etchant can also have an etch selectivity of the second liner layer 180 to the first liner layer 168 of about 50:1 to about 80:1 or more, for example about 100:1 or more, such as about 100:1 to about 200:1. Alternatively, a different etchant having such an etch selectivity of the second liner layer 180 to the first liner layer 168 can be used. In such cases, the second liner layer 180 may be etched by multiple selective etching processes, in which a first selective etch process is performed to selectively remove the second liner layer 180 over the oxide layer, followed by a second selective etch process to remove the second liner layer 180 over the first liner layer 168. The remaining second liner layer 180 (e.g., second liner layer 180 over the epitaxy features at drain regions "D") that is not removed can still provide mechanical support for the oxide layer 170.

An exemplary etch process may include exposing at least the backside of the substrate 104 to an etchant solution that reacts with and dissolves the second liner layer 180. The etchant solution may include or be tetramethylammonium hydroxide (TMAH), tetrabutylammonium hydroxide (TBAH), benzyltrimethylammonium hydroxide, monoethanolamine, or the like, or any combination thereof. The exposure time of the backside of the substrate 104 to the etchant solution may be about 15 second to about 60 minutes, such as about 30 seconds to about 10 minutes, depending on the etchant solution used.

Figure 25:
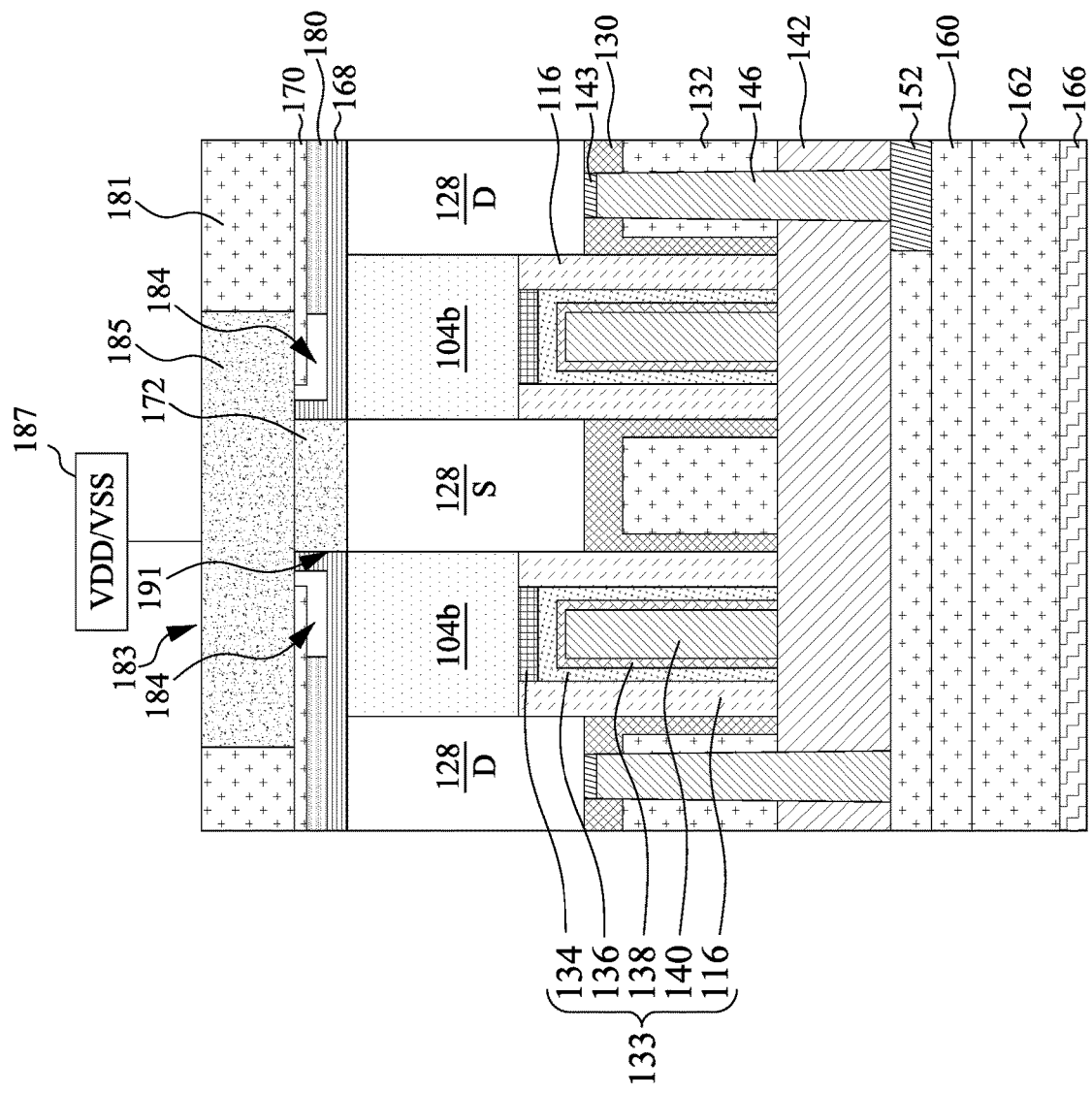

After the air gaps (e.g., air gaps 182, 184, and 186) are formed, an interlayer dielectric (ILD) 181, such as the ILD 173, is deposited on the top surfaces of the oxide layer 170, the conductive feature 172 and the first liner layer 168, and on the regions of the air gaps 184 surrounding the first liner layer 168, as shown in FIG. 25. After the ILD 173 is deposited, a power rail 183 is provided in the ILD 181 and in contact with the conductive feature 172. The power rail 183 can be formed by etching the ILD 181 (e.g., by an isotropic dry etch or a wet etch process) to create a trench that exposes the top surface of the conductive feature 172. Then, a conductive layer 185, such as the material used for the conductive feature 172, is deposited into the trench until the trench is filled. A planarization process may be performed so that the top surfaces of the conductive layer 185 and the ILD 181 are co-planar.

Likewise, the power rail 183 is electrically connected to a power supply node 187. Depending on the conductivity type of the device (e.g., n-type or p-type FinFET device), the power supply node 187 may be fed with a positive voltage (VDD) or a negative voltage (VS S) (i.e., ground or zero voltage).

Embodiments of the present disclosure provide a semiconductor device structure having an air gap enclosing a conductive feature that connects a source/drain region of the device to a power rail disposed at a backside of the device. A nitride liner may be disposed between the air gap and the conductive feature. The air gap and the optional nitride liner can effectively reduce a leakage current that may otherwise flow as a result of capacitive coupling formed between the conductive feature and neighboring channel regions (located between source and drain regions) during operation. It has been observed that the coupling capacitance between the conductive feature and the rest of the device can be reduced about 5%-7% (compared to the case in which no air gap is used) when providing air gaps around the conductive feature, and about 3%-5% when providing air gas around the nitride liner and the conductive feature. As a result, a parasitic capacitance between the conductive feature and neighboring components is reduced, and overall performance of the semiconductor devices is improved.

In one embodiment, a semiconductor device structure is provided. The semiconductor device structure a first source/drain region, a second source/drain region, and a gate stack disposed between the first source/drain region and the second source/drain region. The semiconductor device structure also includes a conductive feature disposed below the first source/drain region. The semiconductor device structure also includes a power rail disposed below and in contact with the conductive feature. semiconductor device structure also includes a dielectric layer enclosing the conductive feature, wherein an air gap is formed between the dielectric layer and the conductive feature.

In another embodiment, a semiconductor device structure is provided. The semiconductor device structure a substrate, a fin extending along a first direction on the substrate, and a gate stack extending across the fin along a second direction substantially perpendicular to the first direction. The semiconductor device structure also includes a first source/drain epitaxy feature and a second source/drain epitaxy feature disposed in opposing regions of the fin with respect to the gate stack, and a conductive feature disposed below the first source/drain epitaxy feature. The semiconductor device structure also includes a power rail disposed below and in contact with the conductive feature, and a liner enclosing sidewalls of the conductive feature, wherein an air gap is formed in the liner.

In yet another embodiment, a semiconductor device structure is provided. The semiconductor device structure includes a first epitaxy feature in contact with a conductive feature, a second epitaxy feature disposed adjacent to the first epitaxy feature, and a silicon portion disposed between the first epitaxy feature and the second epitaxy feature. The semiconductor device structure also includes an oxide layer disposed over the second epitaxy feature and the silicon portion and around a sidewall of the conductive feature. The semiconductor device structure further includes a first liner layer disposed between the oxide layer and the second epitaxy feature, wherein a portion of the second epitaxy feature, the silicon portion, a portion of the oxide layer, and the sidewall of the conductive feature are exposed to an air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
a first source/drain region;
a second source/drain region;

a gate stack disposed between the first source/drain region and the second source/drain region;

a conductive feature in contact with the first source/drain region, wherein the first source/drain region is between the conductive feature and an interlayer dielectric;

a power rail disposed in contact with the conductive feature, wherein the conductive feature is between the power rail and the first source/drain region; and a dielectric layer enclosing the conductive feature, wherein an air gap is formed between the dielectric layer and the conductive feature, and the conductive feature is exposed to the air gap.

2. The semiconductor device structure of claim 1, further comprising:

a first liner layer disposed between the air gap and the conductive feature.

3. The semiconductor device structure of claim 2, wherein the first liner layer includes nitrogen.

4. The semiconductor device structure of claim 2, wherein the first source/drain region is a source terminal and the second source/drain region is a drain terminal.

5. The semiconductor device structure of claim 2, wherein the first liner layer overlaps the second source/drain region with respect to a plain view of the semiconductor device structure.

6. The semiconductor device structure of claim 5, wherein the air gap overlaps the second source/drain region with respect to a plain view of the semiconductor device structure.

7. The semiconductor device structure of claim 5, further comprising:

a second liner layer disposed between the dielectric layer and the first liner layer.

8. The semiconductor device structure of claim 7, wherein the second liner layer comprises amorphous silicon or polysilicon.

9. A semiconductor device structure, comprising:

a substrate;

a fin extending along a first direction on the substrate;

a gate stack extending across the fin along a second direction substantially perpendicular to the first direction;

a first source/drain epitaxy feature and a second source/drain epitaxy feature disposed in opposing regions of the fin with respect to the gate stack;

a conductive feature disposed below the first source/drain epitaxy feature;

a power rail disposed below and in contact with the conductive feature; and a liner enclosing sidewalls of the conductive feature, wherein an air gap is formed in the liner, and the liner comprises:

a first liner layer disposed below the second source/drain epitaxy feature and in contact with the sidewalls of the conductive feature; and a second liner layer in contact with the first liner.

10. The semiconductor device structure of claim 9, wherein the air gap has an L-shaped profile with respect to a cross-sectional view of the semiconductor device structure.

11. The semiconductor device structure of claim 9, wherein the first liner layer and the second liner layer are exposed to the air gap.

12. The semiconductor device structure of claim 9, wherein a portion of the power rail is exposed to the air gap.

13. The semiconductor device structure of claim 9, further comprising:

a dielectric layer in contact with the second liner.

14. The semiconductor device structure of claim 13, wherein a portion of the dielectric layer is exposed to the air gap.

15. A semiconductor device structure, comprising:

a first epitaxy feature in contact with a conductive feature;

a second epitaxy feature disposed adjacent to the first epitaxy feature;

a silicon portion disposed between the first epitaxy feature and the second epitaxy feature;

an oxide layer disposed over the second epitaxy feature and the silicon portion and around a sidewall of the conductive feature; and a first liner layer disposed between the oxide layer and the second epitaxy feature, wherein a portion of the second epitaxy feature, the silicon portion, a portion of the oxide layer, and the sidewall of the conductive feature are exposed to an air gap.

16. The semiconductor device structure of claim 15, wherein the air gap has an L-shaped profile with respect to a cross-sectional view of the semiconductor device structure.

17. The semiconductor device structure of claim 15, wherein the air gap has a first dimension between the oxide layer and the second epitaxy feature and a second dimension between the oxide layer and the silicon portion, and the second dimension is greater than the first dimension.

18. The semiconductor device structure of claim 15, wherein a portion of the first epitaxy feature is exposed to the air gap.

19. The semiconductor device structure of claim 15, wherein the first liner layer includes nitrogen.

20. The semiconductor device structure of claim 9, wherein the second liner layer is disposed radially outward of the air gap.

* * * * *